(12) United States Patent
Volosskiy et al.

(10) Patent No.: US 12,211,691 B2
(45) Date of Patent: *Jan. 28, 2025

(54) DRY DEVELOPMENT OF RESISTS

(71) Applicant: Lam Research Corporation, Fremont, CA (US)

(72) Inventors: Boris Volosskiy, San Jose, CA (US); Timothy William Weidman, Sunnyvale, CA (US); Samantha SiamHwa Tan, Fremont, CA (US); Chenghao Wu, Berkeley, CA (US); Kevin Gu, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 392 days.

This patent is subject to a terminal disclaimer.

(21) Appl. No.: 17/309,587

(22) PCT Filed: Dec. 19, 2019

(86) PCT No.: PCT/US2019/067540
§ 371 (c)(1),
(2) Date: Jun. 8, 2021

(87) PCT Pub. No.: WO2020/132281
PCT Pub. Date: Jun. 25, 2020

(65) Prior Publication Data
US 2022/0020584 A1    Jan. 20, 2022

Related U.S. Application Data

(60) Provisional application No. 62/782,578, filed on Dec. 20, 2018.

(51) Int. Cl.
*H01L 21/027*   (2006.01)
*G03F 7/16*    (2006.01)
(Continued)

(52) U.S. Cl.
CPC .......... *H01L 21/0274* (2013.01); *G03F 7/162* (2013.01); *G03F 7/167* (2013.01); *G03F 7/36* (2013.01); *H01L 21/308* (2013.01)

(58) Field of Classification Search
CPC ... H01L 21/0274; H01L 21/308; G03F 7/162; G03F 7/167; G03F 7/36; G03F 7/0042; G03F 7/38; G03F 7/427
See application file for complete search history.

(56) References Cited

U.S. PATENT DOCUMENTS

| 3,442,648 A | 5/1969 | Smith et al. |
| 3,513,010 A | 5/1970 | Notley |

(Continued)

FOREIGN PATENT DOCUMENTS

| CN | 101098575 A | 1/2008 |
| CN | 102027577 A | 4/2011 |

(Continued)

OTHER PUBLICATIONS

Fukuda et al. (JP H07-106224 A, Machine Translation), Abstract, para. 0023, claim 1. (Year: 2023).*

(Continued)

*Primary Examiner* — Duy Vu N Deo
*Assistant Examiner* — Christopher Remavege
(74) *Attorney, Agent, or Firm* — Weaver Austin Villeneuve & Sampson LLP

(57) ABSTRACT

Dry development of resists can be useful, for example, to form a patterning mask in the context of high-resolution patterning. Dry development may be advantageously accomplished by a method of processing a semiconductor substrate including providing in a process chamber a photopatterned resist on a substrate layer on a semiconductor substrate, and dry developing the photopatterned resist by removing either an exposed portion or an unexposed portion (Continued)

of the resist by a dry development process comprising exposure to a chemical compound to form a resist mask. The resist may be an EUV-sensitive organo-metal oxide or organo-metal-containing thin film EUV resist.

12 Claims, 5 Drawing Sheets

(51) Int. Cl.
    *G03F 7/36*            (2006.01)
    *H01L 21/308*      (2006.01)

(56) References Cited

U.S. PATENT DOCUMENTS

| | | |
|---|---|---|
| 3,529,963 A | 9/1970 | Marchese |
| 3,576,755 A | 4/1971 | Patella et al. |
| 3,720,515 A | 3/1973 | Stanley |
| 4,061,829 A | 12/1977 | Taylor |
| 4,241,165 A | 12/1980 | Hughes et al. |
| 4,292,384 A * | 9/1981 | Straughan ................. G03F 7/36 |
| | | 430/323 |
| 4,328,298 A | 5/1982 | Nester |
| 4,341,592 A | 7/1982 | Shortes et al. |
| 4,396,704 A | 8/1983 | Taylor |
| 4,590,149 A | 5/1986 | Nakane et al. |
| 4,738,748 A | 4/1988 | Kisa |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 4,956,204 A | 9/1990 | Amazawa et al. |
| 5,077,085 A | 12/1991 | Schnur et al. |
| 5,079,600 A | 1/1992 | Schnur et al. |
| 5,094,936 A | 3/1992 | Misium et al. |
| 5,206,706 A * | 4/1993 | Quinn ................. G01N 21/211 |
| | | 356/369 |
| 5,322,765 A | 6/1994 | Clecak et al. |
| 5,399,464 A | 3/1995 | Lee |
| 5,445,988 A | 8/1995 | Schwalke |
| 5,534,312 A | 7/1996 | Hill et al. |
| 5,761,023 A | 6/1998 | Lue et al. |
| 5,914,278 A | 6/1999 | Boitnott et al. |
| 5,925,494 A | 7/1999 | Horn |
| 6,013,418 A | 1/2000 | Ma et al. |
| 6,017,553 A | 1/2000 | Burrell et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,261,938 B1 | 7/2001 | Beauvais et al. |
| 6,290,779 B1 | 9/2001 | Saleh |
| 6,313,035 B1 | 11/2001 | Sandhu et al. |
| 6,319,654 B1 | 11/2001 | Kim et al. |
| 6,348,239 B1 | 2/2002 | Hill et al. |
| 6,410,421 B1 | 6/2002 | Ghandehari et al. |
| 6,448,097 B1 | 9/2002 | Singh et al. |
| 6,573,030 B1 | 6/2003 | Fairbairn et al. |
| 6,607,867 B1 * | 8/2003 | Kim ..................... G03F 7/0395 |
| | | 430/323 |
| 6,666,986 B1 | 12/2003 | Vaartstra |
| 6,797,439 B1 | 9/2004 | Alpay |
| 6,833,306 B2 | 12/2004 | Lyding et al. |
| 6,841,341 B2 | 1/2005 | Fairbairn et al. |
| 6,841,943 B2 | 1/2005 | Vahedi et al. |
| 7,112,489 B1 | 9/2006 | Lyons et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 8,383,316 B2 | 2/2013 | Cooper et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,261,784 B2 | 2/2016 | Wuister et al. |
| 9,281,207 B2 | 3/2016 | Stowers et al. |
| 9,310,684 B2 * | 4/2016 | Meyers ................... G03F 7/322 |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,719,169 B2 | 8/2017 | Mohn et al. |
| 9,778,561 B2 | 10/2017 | Marks et al. |
| 9,823,564 B2 | 11/2017 | Stowers et al. |
| 9,829,805 B2 | 11/2017 | Michaelson et al. |
| 9,996,004 B2 | 6/2018 | Smith et al. |
| 10,025,179 B2 | 7/2018 | Meyers et al. |
| 10,074,543 B2 | 9/2018 | Mahorowala et al. |
| 10,228,618 B2 * | 3/2019 | Meyers ................. G03F 7/2004 |
| 10,416,554 B2 | 9/2019 | Meyers et al. |
| 10,514,598 B2 | 12/2019 | Marks et al. |
| 10,566,212 B2 | 2/2020 | Kanarik |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,763,083 B2 | 9/2020 | Yang et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 12,105,422 B2 | 10/2024 | Tan et al. |
| 2001/0024769 A1 | 9/2001 | Donoghue et al. |
| 2001/0055731 A1 | 12/2001 | Irie |
| 2002/0015855 A1 | 2/2002 | Sajoto et al. |
| 2002/0017243 A1 | 2/2002 | Pyo |
| 2002/0123221 A1 | 9/2002 | Jost et al. |
| 2002/0180372 A1 | 12/2002 | Yamazaki |
| 2002/0185067 A1 | 12/2002 | Upham |
| 2003/0008246 A1 | 1/2003 | Cheng et al. |
| 2003/0027060 A1 | 2/2003 | Lederer |
| 2003/0049571 A1 | 3/2003 | Hallock et al. |
| 2003/0134231 A1 | 7/2003 | Tsai et al. |
| 2003/0183244 A1 | 10/2003 | Rossman |
| 2004/0067444 A1 | 4/2004 | Wakabayashi et al. |
| 2004/0097388 A1 | 5/2004 | Brask et al. |
| 2004/0103914 A1 | 6/2004 | Cheng et al. |
| 2004/0113087 A1 | 6/2004 | Ikeda et al. |
| 2004/0115956 A1 | 6/2004 | Ishida |
| 2004/0175631 A1 | 9/2004 | Crocker et al. |
| 2004/0191423 A1 | 9/2004 | Ruan et al. |
| 2004/0203256 A1 | 10/2004 | Yang et al. |
| 2004/0209201 A1 | 10/2004 | Nakano et al. |
| 2004/0213563 A1 | 10/2004 | Irie |
| 2004/0229169 A1 | 11/2004 | Sandstrom |
| 2004/0233401 A1 | 11/2004 | Irie |
| 2005/0142885 A1 | 6/2005 | Shinriki |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2005/0257747 A1 | 11/2005 | Wakabayashi et al. |
| 2006/0001064 A1 | 1/2006 | Hill et al. |
| 2006/0046470 A1 | 3/2006 | Becknell et al. |
| 2006/0068173 A1 | 3/2006 | Kajiyama et al. |
| 2006/0128127 A1 | 6/2006 | Seo et al. |
| 2006/0147818 A1 | 7/2006 | Lee |
| 2006/0151462 A1 * | 7/2006 | Lee ............................ F27B 5/14 |
| | | 219/390 |
| 2006/0166537 A1 | 7/2006 | Thompson et al. |
| 2006/0172530 A1 | 8/2006 | Cheng et al. |

(56) References Cited

U.S. PATENT DOCUMENTS

| | | |
|---|---|---|
| 2006/0175558 A1 | 8/2006 | Bakker et al. |
| 2006/0246713 A1 | 11/2006 | Tsai et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0259492 A1 | 11/2007 | Roh et al. |
| 2007/0287073 A1 | 12/2007 | Goodwin |
| 2008/0070128 A1 | 3/2008 | Wu et al. |
| 2008/0131616 A1 | 6/2008 | Besson et al. |
| 2008/0157011 A1 | 7/2008 | Nagai et al. |
| 2009/0134119 A1 | 5/2009 | Matsumaru et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0009274 A1 | 1/2010 | Yamamoto |
| 2010/0022078 A1 | 1/2010 | Rockenberger et al. |
| 2010/0051446 A1 | 3/2010 | Wang et al. |
| 2010/0068660 A1 | 3/2010 | Shibazaki et al. |
| 2010/0086880 A1 | 4/2010 | Saito et al. |
| 2010/0131093 A1 | 5/2010 | Yokoyama et al. |
| 2010/0197135 A1 | 8/2010 | Ishizaka |
| 2010/0260994 A1 | 10/2010 | Groenen et al. |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0104595 A1 | 5/2011 | Hayashi et al. |
| 2011/0117702 A1 | 5/2011 | Rietzler et al. |
| 2011/0195142 A1 | 8/2011 | Mitamura et al. |
| 2011/0198756 A1 | 8/2011 | Thenappan et al. |
| 2011/0200953 A1 | 8/2011 | Arima et al. |
| 2011/0209725 A1 | 9/2011 | Kim et al. |
| 2011/0242508 A1 | 10/2011 | Kobayashi |
| 2011/0244680 A1 | 10/2011 | Tohnoe et al. |
| 2011/0266252 A1 | 11/2011 | Thadani et al. |
| 2011/0292356 A1 | 12/2011 | Tsukinoki et al. |
| 2012/0024388 A1 | 2/2012 | Burrows et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0161405 A1 | 6/2012 | Mohn et al. |
| 2012/0183689 A1 | 7/2012 | Suzuki et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1* | 12/2012 | Wu ........................... G03F 7/40 430/432 |
| 2013/0023124 A1 | 1/2013 | Nemani et al. |
| 2013/0129995 A1* | 5/2013 | Ouattara ................ G03F 7/092 428/209 |
| 2013/0157177 A1 | 6/2013 | Yu et al. |
| 2013/0164691 A1 | 6/2013 | Shiobara |
| 2013/0177847 A1 | 7/2013 | Chatterjee et al. |
| 2013/0183609 A1 | 7/2013 | Seon et al. |
| 2013/0224652 A1 | 8/2013 | Bass et al. |
| 2013/0273733 A1 | 10/2013 | Tang et al. |
| 2013/0299089 A1 | 11/2013 | Kim et al. |
| 2013/0319466 A1 | 12/2013 | Mizoguchi et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0120688 A1 | 5/2014 | Booth, Jr. et al. |
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0255844 A1 | 9/2014 | Iwao et al. |
| 2014/0261568 A1 | 9/2014 | Delgado et al. |
| 2014/0263172 A1* | 9/2014 | Xie ................... H01L 21/68707 216/41 |
| 2014/0268082 A1 | 9/2014 | Michaelson et al. |
| 2014/0272726 A1 | 9/2014 | Chang |
| 2015/0020848 A1 | 1/2015 | Kim et al. |
| 2015/0041809 A1 | 2/2015 | Arnold et al. |
| 2015/0056542 A1* | 2/2015 | Meyers ..................... G03F 7/30 430/296 |
| 2015/0077733 A1 | 3/2015 | Huang et al. |
| 2015/0079393 A1 | 3/2015 | Freedman et al. |
| 2015/0096683 A1 | 4/2015 | Deshmukh et al. |
| 2015/0125679 A1 | 5/2015 | Ishikawa et al. |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0218695 A1 | 8/2015 | Odedra |
| 2015/0221519 A1 | 8/2015 | Marks et al. |
| 2015/0243520 A1 | 8/2015 | Park et al. |
| 2015/0270148 A1 | 9/2015 | Shinoda et al. |
| 2015/0303064 A1 | 10/2015 | Singer et al. |
| 2015/0332922 A1 | 11/2015 | Chien et al. |
| 2015/0355549 A1 | 12/2015 | Xie et al. |
| 2016/0011505 A1 | 1/2016 | Stowers et al. |
| 2016/0011516 A1 | 1/2016 | Villiers |
| 2016/0021660 A1 | 1/2016 | Krishnamurthy |
| 2016/0035631 A1 | 2/2016 | Lee et al. |
| 2016/0041471 A1 | 2/2016 | Briend et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0126106 A1 | 5/2016 | Shimizu et al. |
| 2016/0135274 A1 | 5/2016 | Fischer et al. |
| 2016/0179005 A1 | 6/2016 | Shamma et al. |
| 2016/0216606 A1* | 7/2016 | Meyers ................ G03F 7/0042 |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0343544 A1 | 11/2016 | Watanabe et al. |
| 2016/0357103 A1 | 12/2016 | Nagahara et al. |
| 2016/0357107 A1 | 12/2016 | Buchberger, Jr. et al. |
| 2016/0365248 A1 | 12/2016 | Mebarki et al. |
| 2016/0379824 A1 | 12/2016 | Wise et al. |
| 2017/0004974 A1 | 1/2017 | Manna et al. |
| 2017/0010535 A1 | 1/2017 | Fujitani et al. |
| 2017/0069462 A1 | 3/2017 | Kanarik et al. |
| 2017/0092495 A1* | 3/2017 | Chen ..................... G03F 7/091 |
| 2017/0102612 A1* | 4/2017 | Meyers ................ G03F 7/0042 |
| 2017/0146909 A1* | 5/2017 | Smith .................. G03F 7/0042 |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0261850 A1* | 9/2017 | Stowers ............. H01L 21/0337 |
| 2017/0342553 A1 | 11/2017 | Yu et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0093306 A1 | 4/2018 | Kang et al. |
| 2018/0096840 A1 | 4/2018 | Jeong et al. |
| 2018/0122648 A1 | 5/2018 | Kim et al. |
| 2018/0149976 A1 | 5/2018 | Liu et al. |
| 2018/0151350 A1 | 5/2018 | Li |
| 2018/0164689 A1 | 6/2018 | Sano et al. |

(56) References Cited

U.S. PATENT DOCUMENTS

| | | |
|---|---|---|
| 2018/0166278 A1 | 6/2018 | Belyansky et al. |
| 2018/0173096 A1 | 6/2018 | Zi et al. |
| 2018/0224744 A1 | 8/2018 | Bae et al. |
| 2018/0233362 A1 | 8/2018 | Glodde et al. |
| 2018/0233398 A1 | 8/2018 | Van Cleemput et al. |
| 2018/0294155 A1 | 10/2018 | Soppera et al. |
| 2018/0307137 A1 | 10/2018 | Meyers et al. |
| 2018/0308687 A1 | 10/2018 | Smith et al. |
| 2018/0314167 A1* | 11/2018 | Chang ............... H01L 21/68764 |
| 2018/0323064 A1 | 11/2018 | Jung et al. |
| 2018/0330930 A1 | 11/2018 | Murakami et al. |
| 2018/0337046 A1 | 11/2018 | Shamma et al. |
| 2018/0337243 A1 | 11/2018 | Li et al. |
| 2018/0354804 A1 | 12/2018 | Venkatasubramanian et al. |
| 2018/0356731 A1 | 12/2018 | Tagawa |
| 2019/0027357 A1 | 1/2019 | Girard et al. |
| 2019/0041755 A1 | 2/2019 | Tanaka et al. |
| 2019/0043731 A1 | 2/2019 | Bristol et al. |
| 2019/0094685 A1 | 3/2019 | Marks et al. |
| 2019/0129307 A1 | 5/2019 | Kwon et al. |
| 2019/0131130 A1* | 5/2019 | Smith ..................... C23C 16/52 |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0382890 A1 | 12/2019 | Lerner et al. |
| 2019/0391486 A1 | 12/2019 | Jiang et al. |
| 2020/0041897 A1* | 2/2020 | Moon .................... G03F 7/0048 |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0133131 A1 | 4/2020 | Ouyang |
| 2020/0133133 A1* | 4/2020 | Park .................... H01L 21/0273 |
| 2020/0166845 A1 | 5/2020 | Berendsen et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2020/0393765 A1 | 12/2020 | Sakanishi |
| 2021/0005425 A1 | 1/2021 | Yang et al. |
| 2021/0013034 A1 | 1/2021 | Wu et al. |
| 2021/0013037 A1 | 1/2021 | Sun et al. |
| 2021/0041784 A1 | 2/2021 | Chen et al. |
| 2021/0271170 A1 | 9/2021 | Telecky et al. |
| 2021/0302833 A1 | 9/2021 | Weng et al. |
| 2021/0305040 A1 | 9/2021 | Kuo et al. |
| 2021/0397085 A1 | 12/2021 | Weidman et al. |
| 2022/0002882 A1 | 1/2022 | Kalutarage et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0179328 A1 | 6/2022 | Xia et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2022/0404713 A1 | 12/2022 | Tapily |
| 2023/0031955 A1 | 2/2023 | Yu et al. |
| 2023/0045336 A1 | 2/2023 | Yu et al. |
| 2023/0078946 A1 | 3/2023 | Grzeskowiak et al. |
| 2023/0100995 A1 | 3/2023 | Cardineau et al. |
| 2023/0107357 A1 | 4/2023 | Dictus et al. |
| 2023/0152701 A1 | 5/2023 | Kanakasabapathy |
| 2023/0230811 A1 | 7/2023 | Yu et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0290657 A1 | 9/2023 | Yu et al. |
| 2023/0314946 A1 | 10/2023 | Hansen et al. |
| 2023/0314954 A1 | 10/2023 | Peter et al. |
| 2023/0341781 A1 | 10/2023 | Han et al. |
| 2023/0416606 A1 | 12/2023 | Dictus et al. |
| 2024/0027900 A1 | 1/2024 | Hajibabaeinajafabadi et al. |
| 2024/0036473 A1 | 2/2024 | Fujimoto et al. |
| 2024/0036483 A1 | 2/2024 | Dictus et al. |
| 2024/0045337 A1 | 2/2024 | Hajibabaeinajafabadi et al. |
| 2024/0053684 A1 | 2/2024 | Hajibabaeinajafabadi et al. |
| 2024/0134274 A1 | 4/2024 | Weidman et al. |
| 2024/0145272 A1 | 5/2024 | Yu et al. |
| 2024/0329538 A1 | 10/2024 | Li et al. |
| 2024/0355650 A1 | 10/2024 | Kanakasabapathy et al. |
| 2024/0361696 A1 | 10/2024 | Tan et al. |

FOREIGN PATENT DOCUMENTS

| | | |
|---|---|---|
| CN | 102610516 A | 7/2012 |
| CN | 103119695 A | 5/2013 |
| CN | 103243310 A | 8/2013 |
| CN | 105047541 A | 11/2015 |
| CN | 105579906 A | 5/2016 |
| CN | 106558477 A | 4/2017 |
| CN | 106876251 A | 6/2017 |
| CN | 107153326 A | 9/2017 |
| CN | 108351594 A | 7/2018 |
| CN | 108388079 A | 8/2018 |
| CN | 108780739 A | 11/2018 |
| CN | 109521657 A | 3/2019 |
| CN | 109976097 A | 7/2019 |
| CN | 111258190 A | 6/2020 |
| EP | 0197286 A2 | 10/1986 |
| EP | 0197286 B1 | 9/1991 |
| EP | 0465064 A2 | 1/1992 |
| EP | 1123423 B1 | 8/2007 |
| EP | 2608247 A1 | 6/2013 |
| EP | 3230294 A1 | 10/2017 |
| EP | 3258317 A1 | 12/2017 |
| EP | 3451059 A1 | 3/2019 |
| JP | S5119974 A | 2/1976 |
| JP | S57205736 A | 12/1982 |
| JP | S58108744 A | 6/1983 |
| JP | S6112653 U | 1/1986 |
| JP | S61234035 A | 10/1986 |
| JP | S6347364 A | 2/1988 |
| JP | H04226462 A | 8/1992 |
| JP | H0637050 A | 2/1994 |
| JP | H06169021 A | 6/1994 |
| JP | H06232041 A | 8/1994 |
| JP | 07-106224 A | 4/1995 |
| JP | H07161607 A | 6/1995 |
| JP | H0869959 A | 3/1996 |
| JP | H08316237 A | 11/1996 |
| JP | H08339950 A | 12/1996 |
| JP | H1041206 A | 2/1998 |
| JP | H10209133 A | 8/1998 |
| JP | 2000305273 A | 11/2000 |
| JP | 2000347413 A | 12/2000 |
| JP | 2000347421 A | 12/2000 |

(56) References Cited

FOREIGN PATENT DOCUMENTS

| | | |
|---|---|---|
| JP | 2000356857 A | 12/2000 |
| JP | 2001089860 A | 4/2001 |
| JP | 2001308019 A | 11/2001 |
| JP | 2002100558 A | 4/2002 |
| JP | 2002118096 A | 4/2002 |
| JP | 2003131364 A | 5/2003 |
| JP | 2003-213001 A | 7/2003 |
| JP | 2003-532303 A | 10/2003 |
| JP | 2003280155 A | 10/2003 |
| JP | 2004-006798 A | 1/2004 |
| JP | 2004513515 A | 4/2004 |
| JP | 2004247678 A | 9/2004 |
| JP | 2004259786 A | 9/2004 |
| JP | 2005-504146 A | 2/2005 |
| JP | 2005260015 A | 9/2005 |
| JP | 2006-253282 A | 9/2006 |
| JP | 2006310681 A | 11/2006 |
| JP | 2007027617 A | 2/2007 |
| JP | 2007114255 A | 5/2007 |
| JP | 2008091215 A | 4/2008 |
| JP | 2009192350 A | 8/2009 |
| JP | 2009212404 A | 9/2009 |
| JP | 2010016083 A | 1/2010 |
| JP | 2010016314 A | 1/2010 |
| JP | 2010500762 A | 1/2010 |
| JP | 2010067979 A | 3/2010 |
| JP | 2010123732 A | 6/2010 |
| JP | 2010531931 A | 9/2010 |
| JP | 2010239087 A | 10/2010 |
| JP | 2011-520242 A | 7/2011 |
| JP | 2011526082 A | 9/2011 |
| JP | 2011-529126 A | 12/2011 |
| JP | 2012074738 A | 4/2012 |
| JP | 2012142481 A | 7/2012 |
| JP | 2012-185485 A | 9/2012 |
| JP | 2012173315 A | 9/2012 |
| JP | 5055743 B2 | 10/2012 |
| JP | 2012191242 A | 10/2012 |
| JP | 2013033291 A | 2/2013 |
| JP | 2013047848 A | 3/2013 |
| JP | 2013096011 A | 5/2013 |
| JP | 2013526061 A | 6/2013 |
| JP | 2013145874 A | 7/2013 |
| JP | 2013151627 A | 8/2013 |
| JP | 2014504004 A | 2/2014 |
| JP | 5544914 B2 | 7/2014 |
| JP | 2014-521111 A | 8/2014 |
| JP | 2015012198 A | 1/2015 |
| JP | 2015504604 A | 2/2015 |
| JP | 5705103 B2 | 4/2015 |
| JP | 2015-201622 A | 11/2015 |
| JP | 2016072557 A | 5/2016 |
| JP | 2016517633 A | 6/2016 |
| JP | 2016131238 A | 7/2016 |
| JP | 2016208027 A | 12/2016 |
| JP | 2017500448 A | 1/2017 |
| JP | 2017045869 A | 3/2017 |
| JP | 2017108053 A | 6/2017 |
| JP | 2017116923 A | 6/2017 |
| JP | 2018006742 A | 1/2018 |
| JP | 2018502173 A | 1/2018 |
| JP | 2018025686 A | 2/2018 |
| JP | 2018098229 A | 6/2018 |
| JP | 2018518688 A | 7/2018 |
| JP | 2018164076 A | 10/2018 |
| JP | 2018200930 A | 12/2018 |
| JP | 2019500490 A | 1/2019 |
| JP | 2019024129 A | 2/2019 |
| JP | 2019506730 A | 3/2019 |
| JP | 2019053305 A | 4/2019 |
| JP | 2019056730 A | 4/2019 |
| JP | 2019135755 A | 8/2019 |
| JP | 2019192814 A | 10/2019 |
| JP | 2021523403 A | 9/2021 |
| KR | 890015374 A | 10/1989 |
| KR | 900001238 B1 | 3/1990 |
| KR | 950001406 A | 1/1995 |
| KR | 960000375 B1 | 1/1996 |
| KR | 19990029141 A | 4/1999 |
| KR | 20000073111 A | 12/2000 |
| KR | 20020000292 A | 1/2002 |
| KR | 20050112115 A | 11/2005 |
| KR | 100575847 B1 | 5/2006 |
| KR | 20070003657 A | 1/2007 |
| KR | 20080046577 A | 5/2008 |
| KR | 100841495 B1 | 6/2008 |
| KR | 2009-0042059 A | 4/2009 |
| KR | 20100090643 A | 8/2010 |
| KR | 20110007192 A | 1/2011 |
| KR | 20130007389 A | 1/2013 |
| KR | 2013/0093038 A | 8/2013 |
| KR | 101426105 B1 | 8/2014 |
| KR | 20140106442 A | 9/2014 |
| KR | 20140109816 A | 9/2014 |
| KR | 20150091260 A | 8/2015 |
| KR | 20150127145 A | 11/2015 |
| KR | 20160035995 A | 4/2016 |
| KR | 20170066218 A | 6/2017 |
| KR | 20170066225 A | 6/2017 |
| KR | 20180036263 A | 4/2018 |
| KR | 20180054917 A | 5/2018 |
| KR | 20180116438 A | 10/2018 |
| KR | 20190085654 A | 7/2019 |
| KR | 20190139594 A | 12/2019 |
| KR | 20190142242 A | 12/2019 |
| KR | 20210142118 A | 11/2021 |
| KR | 20220025020 A | 3/2022 |
| TW | 200504864 A | 2/2005 |
| TW | 200903686 A | 1/2009 |
| TW | 200947117 A | 11/2009 |
| TW | 201005568 A | 2/2010 |
| TW | 201145383 A | 12/2011 |
| TW | 201224190 A | 6/2012 |
| TW | I365354 B | 6/2012 |
| TW | 201241555 A1 | 10/2012 |
| TW | 201245918 A | 11/2012 |
| TW | 201246273 A | 11/2012 |
| TW | 201330093 A | 7/2013 |
| TW | 201430164 A | 8/2014 |
| TW | 201501179 A | 1/2015 |
| TW | I494689 B | 8/2015 |
| TW | 201631377 A | 9/2016 |
| TW | 201729006 A | 8/2017 |
| TW | 201734025 A | 10/2017 |
| TW | 201734667 A | 10/2017 |
| TW | 201811876 A | 4/2018 |
| TW | 201830472 A | 8/2018 |
| TW | 201837066 A | 10/2018 |
| TW | 201930323 A | 8/2019 |
| TW | 201931011 A | 8/2019 |
| TW | 202001407 A | 1/2020 |
| WO | WO 03/029015 A2 | 4/2003 |
| WO | WO 2004/095551 A1 | 11/2004 |
| WO | WO-2007123539 A1 | 11/2007 |
| WO | WO-2008019362 A2 | 2/2008 |
| WO | WO-2008088076 A1 | 7/2008 |
| WO | WO 2011/081151 A1 | 7/2011 |
| WO | WO-2011137059 A2 | 11/2011 |
| WO | WO 2012/048094 A3 | 4/2012 |
| WO | WO-2012075249 A1 | 6/2012 |
| WO | WO-2013007442 A1 | 1/2013 |
| WO | WO-2013078211 A1 | 5/2013 |
| WO | WO 2014/152023 A1 | 9/2014 |
| WO | WO-2015088613 A1 | 6/2015 |
| WO | WO-2016065120 A1 | 4/2016 |
| WO | WO 2016/144960 A1 | 9/2016 |
| WO | WO 2017/066319 A2 | 4/2017 |
| WO | WO-2017109040 A1 | 6/2017 |
| WO | WO-2017153725 A1 | 9/2017 |
| WO | WO 2017/198418 A1 | 11/2017 |
| WO | WO 2018/004551 A1 | 1/2018 |
| WO | WO-2018004646 A1 | 1/2018 |
| WO | WO-2018061670 A1 | 4/2018 |
| WO | WO-2018173446 A1 | 9/2018 |

(56) References Cited

FOREIGN PATENT DOCUMENTS

| | | |
|---|---|---|
| WO | WO-2018180663 A1 | 10/2018 |
| WO | WO-2019023797 A1 | 2/2019 |
| WO | WO-2019163455 A1 | 8/2019 |
| WO | WO 2019/217749 A1 | 9/2019 |
| WO | WO-2019222320 A1 | 11/2019 |
| WO | WO-2019230462 A1 | 12/2019 |
| WO | WO-2019241402 A1 | 12/2019 |
| WO | WO-2020014179 A1 | 1/2020 |
| WO | WO-2020030855 A2 | 2/2020 |
| WO | WO-2020033602 A1 | 2/2020 |
| WO | WO-2020050035 A1 | 3/2020 |
| WO | WO 2020/102085 A1 | 5/2020 |
| WO | WO-2020132281 A1 | 6/2020 |
| WO | WO-2020190941 A1 | 9/2020 |
| WO | WO-2020223011 A1 | 11/2020 |
| WO | WO-2020223152 A1 | 11/2020 |
| WO | WO2020/263750 A1 | 12/2020 |
| WO | WO-2020264158 A1 | 12/2020 |
| WO | WO-2020264557 A1 | 12/2020 |
| WO | WO-2020264571 A1 | 12/2020 |
| WO | WO-2021067632 A2 | 4/2021 |
| WO | WO-2021072042 A1 | 4/2021 |
| WO | WO-2021146138 A1 | 7/2021 |
| WO | WO-2021202681 A1 | 10/2021 |
| WO | WO-2021262371 A1 | 12/2021 |
| WO | WO-2021262529 A1 | 12/2021 |
| WO | WO-2022103764 A1 | 5/2022 |

OTHER PUBLICATIONS

Banerjee, D. et al., "Potential of Metal-Organic Frameworks for Separation of Xenon and Krypton", Accounts of Chemical Research, 2015, vol. 48, No. 2, pp. 211-219.
Bespalov I., et al., "Key Role of Very Low Energy Electrons in Tin-Based Molecular Resists for Extreme Ultraviolet Nanolithography," ACS Applied Materials & Interfaces, 2020, vol. 12, pp. 9881-9889.
Cardineau, B. et al., "EUV Resists Based on Tin-oxo Clusters", Advances in Patterning Materials and Processes XXXI, Proceedings of Spie, Apr. 4, 2014, vol. 9051, pp. 335-346.
Chiang C L., et al., "Secondary Electron Emission Characteristics of Oxide Electrodes in Flat Electron Emission Lamp," AIP Advances, 2016, vol. 6, 015317, 9 Pages.
CN Office Action dated Jun. 1, 2023, in application No. CN201810783756 with English translation.
CN Office Action dated Jun. 8, 2022 in Application No. CN202180002531.2 With English Translation.
CN Office Action dated Nov. 16, 2022, in Application No. CN202180002531.2 with English translation.
CN Office Action dated Nov. 18, 2022, in Application No. CN201810783756.6 with English translation.
Cui L F., et al., "Endohedral Stannaspherenes M@Sn12: A Rich Class of Stable Molecular Cage Clusters," Endohedral Tin Cages, 2007, vol. 46, pp. 742-745.
Danilo D.E., et al., "Metal Containing Resist Readiness for HVM EUV Lithography", Journal of Photopolymer Science and Technology, 2016, vol. 29(3), pp. 501-507.
EP Extended European Search Report dated Jul. 13, 2023, in Application No. EP20831843.6.
EP Extended European Search report dated Jun. 23, 2023, in Application No. EP20831420.3.
EP Extended European Search report dated Jun. 26, 2023, in Application No. 20831242.1.
EP Extended European Search Report dated Jun. 26, 2023, in Application No. 20831343.7.
EP Extended European Search report dated Jun. 28, 2023, in Application No. EP 20832501.9.
EP Partial European Search Report dated Aug. 29, 2023, in Application No. 23173688.5.
European Search Report dated Feb. 15, 2022, in Application No. EP21741104.
European Office Action dated Feb. 25, 2022 in in Application No. 21741104.
Extended European Search Report dated Dec. 23, 2021, in Application No. EP19800353.5.
Fan, Y. et al., (2016) "Benchmarking Study of EUV Resists for NXE:3300B," Proc. of Spie, 9776:97760W-1 to 97760W-11 [Downloaded From http://proceedings.spiedigitallibrary.org/ on Mar. 30, 2017].
Fitzgerald C B., et al., "Magnetism in Dilute Magnetic Oxide Thin Films Based on SnO2," The American Physical Society, 2006, vol. 74, 115307, 10 Pages.
Fujifilm Corp., (Presentation) "Negative tone development process for double patterning," 5th International Symposium on Immersion Lithography, Sep. 2008, Presentation Slides No. P-1-P-27.
Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_ V2.0, pp. 1-9.
Gangnaik, A.S. et al., (Jan. 12, 2017) "New Generation Electron Beam Resists: A Review," Chem. Mater., 29:1898-1917.
Gross, R.A et al., "Biodegradable Polymers for the Environment", Science, Aug. 2, 2002, vol. 297, No. 5582, pp. 803-807.
Harrisson, S. et al., "RAFT Polymerization of Vinyl Esters: Synthesis and Applications", Polymers, 2014, vol. 6, No. 5, pp. 1437-1488.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 13, 2021, in PCT Application No. PCT/US2021/023901.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated May 18, 2022, in International Application No. PCT/US2022/014984.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Aug. 24, 2023, in PCT Application No. PCT/US2022/014984.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.

(56) References Cited

OTHER PUBLICATIONS

International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Jun. 22, 2023, in Application No. PCT/US2021/061751.
International Preliminary Report on Patentability dated May 25, 2023, in Application No. PCT/US2021/058647.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Oct. 13, 2022, in PCT Application No. PCT/US2021/023901.
International Preliminary Report on Patentability dated Sep. 7, 2023, in PCT Application No. PCT/US2022/014281.
International Preliminary Report on Patentability dated Sep. 9, 2022, in PCT Application No. PCT/US2021/019245.
International Preliminary Report on Patentability dated Sep. 30, 2021 issued in Application No. PCT/US2020/023146.
International Search Report and Written Opinion dated Apr. 17, 2023, in Application No. PCT/US2022/081390.
International Search Report and Written Opinion dated Apr. 17, 2023 in PCT Application No. PCT/US2022/081376.
International Search Report and Written Opinion dated Apr. 19, 2023, in Application No. PCT/US2022/081845.
International Search Report and Written Opinion dated Aug. 17, 2023, in Application No. PCT/US2023/019871.
International Search Report and Written Opinion dated Aug. 8, 2018 issued in Application No. PCT/US2018/028192.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Mar. 24, 2022, for International Application No. PCT/US2021/061751.
International Search Report and Written Opinion dated May 3, 2023, in Application No. PCT/US2023/060306.
International Search Report and Written Opinion dated May 16, 2022, In International Application No. PCT/US2022/014281.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 13, 20223 in PCT Application No. PCT/US2023/069419.
International Search Report and Written Opinion dated Oct. 16, 2018 issued in Application No. PCT/US2018/032783.
International Search Report and Written Opinion dated Oct. 28, 2021 in PCT Application No. PCT/US2021/040381.
International Search Report and Written Opinion dated Sep. 15, 2021, in PCT Application No. PCT/US2021/034019.
Jalife S., et al., "Noble Gas Endohedral Fullerenes," Chemical Science, 2020, vol. 11, pp. 6642-6652.
Joo, W. et al., "Synthesis of Unzipping Polyester and a Study of its Photochemistry", Journal of the American Chemical Society, 2019, vol. 141, No. 37, pp. 14736-14741.

JP Office Action dated Jul. 26, 2022 in Application No. JP2021102822 With English translation.
JP Office Action dated Nov. 15, 2022, in Application No. JP2021-176082 with English translation.
JP Office Action dated Apr. 11, 2023 in Application No. JP2021-176082 with English translation.
JP Office Action dated Apr. 27, 2023 in Application No. JP2021-575910 with English translation.
JP Office Action dated Feb. 28, 2023 in Application No. JP2020-562160 with English translation.
JP Office Action dated Jan. 17, 2023, in Application No. JP2022-552422 with English translation.
JP Office Action dated Jun. 14, 2022, in Application No. JP20190563508 with English translation.
JP Office Action dated Jun. 27, 2023, in Application No. JP2022-552422 with English translation.
JP Office Action dated Jun. 27, 2023, in application No. JP2023-63868.
JP Office Action dated Jun. 28, 2022 in Application No. JP2021560945 with English translation.
JP Office Action dated Oct. 3, 2023 in Application No. JP2021-176082 with English Translation.
JP Office Action dated Oct. 10, 2023 in Application No. JP2022-552422 with English Translation.
JP Office Action dated Sep. 19, 2023 in Application No. JP2020-562160 with English translation.
Klepper, K.B et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
Komen C V., et al., "Structure-Magnetic Property Relationship Intransition Metal (M=V,Cr, Mn, Fe, Co, Ni) Doped Sno2 Nanoparticles," Journal of Applied Physics, 2008, vol. 103, 5 Pages.
Korean Decision for Grant dated Sep. 2, 2021 issued in Application No. KR 10-2015-0015184.
KR Office Action dated Feb. 8, 2022, in Application No. KR10-2021-7030794 with English Translation.
KR Office Action dated Aug. 11, 2023, in Application No. KR10-2023-7011840 with English translation.
KR Office Action dated Jan. 2, 2023 in Application No. KR10-2022-7027233 with English translation.
KR Office Action dated May 9, 2022, in Application No. KR1020217030794 with English translation.
KR Office Action dated Sep. 28, 2022, in Application No. KR10-2022-7027233 with English translation.
KR Prior Art Search Report dated Apr. 3, 2023, in application No. KR 10-2022-7029421.
KR Search Report dated Aug. 25, 2023, in Application No. KR10-2021-7022858.
Kvon V., et al., "Secondary Electron Emission of Tin and Tin-Lithium Under Low Energy Helium Plasma Exposure," Nuclear Materials and Energy, 2017, vol. 13, pp. 21-27.
Lin Y., et al., "A New Examination of Secondary Electron Yield Data," Surface and Interface Analysis, 2005, vol. 37, pp. 895-900.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Notice of Allowance dated Dec. 9, 2021 in U.S. Appl. No. 17/310,635.
Ogale S B., et al., "High Temperature Ferromagnetism with Giant Magnetic Moment in Transparent Co-doped $SnO_2$-δ," Physical Review Letters, 2003, 17 Pages.
Pedersen A., et al., "Lithiation of Tin Oxide: A Computational Study," Integrated Systems Laboratory, 2014, 20 Pages.
Rothschild, et al., "Liquid immersion lithography: Why, how, and when?" Journal Vacuum Science Technology, Nov./Dec. 2004, pp. 2877-2881.

(56) References Cited

OTHER PUBLICATIONS

Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Saunders M., et al., "Noble Gas Atoms Inside Fullerenes," Science, 1996, vol. 271, pp. 1693-1697.
Singh R ., "Unexpected Magnetism In Nanomaterials," Journal of Magnetism and Magnetic Materials, 2013, vol. 346, pp. 58-73.
Stulen, et al., "Extreme Ultraviolet Lithography" IEEE Journal of Quantum Electronics, vol. 35, No. 5, May 1999, pp. 694-699.
Sundberg, P. et al., "Organic and Inorganic-organic Thin Film Structures by Molecular Layer Deposition: A Review", Beilstein Journal of Nanotechnology, 2014, vol. 5, pp. 1104-1136.
Taiwanese Office Action dated Apr. 10, 2023 in TW Application No. TW108140940 with English translation.
Tian Y F., et al., "Oxide Magnetic Semiconductors: Materials, Properties, and Devices," Magnetism, Magnetic Materials, and Interdisciplinary Research, 2013, vol. 22(8), 2 Pages.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW First Office Action dated Oct. 6, 2021, in application No. TW20180116415 with English translation.
TW Office Action dated Apr. 29, 2022 in Application No. TW110118172 with English translation.
TW Office Action dated Aug. 17, 2023, in application No. TW110124741 with Translation.
TW Office Action dated Jan. 13, 2023, in Application No. TW110124741 with English translation.
TW Office Action dated Jan. 19, 2023 in Application No. TW110141961 with English translation.
TW Office Action dated Jun. 3, 2022, in Application No. TW110143913 with English translation.
TW Office Action dated Mar. 7, 2022, in Application No. TW110101388 with English translation.
TW Office Action dated May 16, 2023, in Application No. TW20190146890 with English translation.
TW Office Action dated Oct. 13, 2023, in application No. TW109121680.
US Final Office Action, dated Feb. 5, 2019 issued in U.S. Appl. No. 15/495,701.
U.S. Final Office Action dated May 12, 2023 in U.S. Appl. No. 17/455,185.
U.S. Non-Final office Action dated Feb. 7, 2023 in U.S. Appl. No. 17/455,185.
U.S. Non-Final Office Action dated May 11, 2023, in U.S. Appl. No. 17/452,365.
U.S. Non-Final Office Action dated Oct. 13, 2023, in U.S. Appl. No. 18/184,545.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Non-Final Office Action dated Oct. 26, 2023, in U.S. Appl. No. 17/596,648.
U.S. Non-Final Office Action dated Oct. 26, 2023, in U.S. Appl. No. 17/596,928.
U.S. Non-Final Office Action dated Sep. 13, 2023, in U.S. Appl. No. 17/596,651.
U.S. Non-Final Office Action dated Sep. 28, 2023, in U.S. Appl. No. 15/733,598.
U.S. Notice of Allowance dated Aug. 21, 2023 in U.S. Appl. No. 17/452,365.
U.S. Notice of Allowance dated Feb. 22, 2022 in U.S. Appl. No. 17/310,635.
US Notice of Allowance, dated Jun. 10, 2020 issued in U.S. Appl. No. 15/979,340.
U.S. Notice of Allowance dated Oct. 18, 2023 in U.S. Appl. No. 17/309,247.
US Notice of Allowance dated Sep. 15, 2021, issued in U.S. Appl. No. 16/691,508.
US Notice of Allowance, dated Sep. 30, 2021 issued in U.S. Appl. No. 17/008,095.
US Notice of Allowance dated Sep. 9, 2021, issued in U.S. Appl. No. 16/691,508.
US Office Action, dated Aug. 9, 2018 issued in U.S. Appl. No. 15/495,701.
US Office Action, dated Mar. 18, 2021 issued in U.S. Appl. No. 17/008,095.
US Office Action, dated Nov. 6, 2019 issued in U.S. Appl. No. 15/979,340.
U.S. Appl. No. 17/905,754, inventors Kanakasabapathy et al., filed Sep. 6, 2022.
U.S. Appl. No. 18/005,571 inventors Hansen et al., filed on Jan. 13, 2023.
U.S. Appl. No. 18/005,594, inventors Hansen et al., filed Jan. 13, 2023.
U.S. Appl. No. 18/254,787, inventors Dictus D, et al., filed May 26, 2023.
U.S. Appl. No. 18/264,391, inventors Kanakasabapathy S K, et al., filed Aug. 4, 2023.
U.S. Appl. No. 18/298,003, inventors Marks et al., filed Apr. 10, 2023.
U.S. Appl. No. 18/377,245, inventors Dictus D, et al., filed Oct. 5, 2023.
U.S. Appl. No. 18/377,267, inventors Yu J, et al., filed Oct. 5, 2023.
U.S. Appl. No. 18/546,879, inventors Weidman T W, et al., filed Aug. 17, 2023.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.
Notice of Allowance dated Aug. 22, 2017 issued in U.S. Appl. No. 14/610,038.
Final Office Action dated May 11, 2017 issued in U.S. Appl. No. 14/610,038.
Office Action dated Jan. 23, 2017 issued in U.S. Appl. No. 14/610,038.
Office Action dated May 21, 2018 issued in U.S. Appl. No. 15/691,659.
Final Office Action dated Sep. 10, 2018 issued in U.S. Appl. No. 15/691,659.
Office Action dated Apr. 9, 2019 issued in U.S. Appl. No. 15/691,659.
Notice of Allowance dated Sep. 19, 2019 issued in U.S. Appl. No. 15/691,659.
US Office Action, dated Mar. 5, 2020, issued in U.S. Appl. No. 16/206,959.
Notice of Allowance, dated Jul. 28, 2020, issued in U.S. Appl. No. 16/206,959.
Office Action, dated May 14, 2021, issued in U.S. Appl. No. 16/691,508.
US Office Action, dated Nov. 2, 2017, issued in U.S. Appl. No. 14/948,109.
US Notice of Allowance, dated Apr. 25, 2018 issued in U.S. Appl. No. 14/948,109.

(56) References Cited

OTHER PUBLICATIONS

Japanese First Office Action dated Sep. 15, 2020 issued in Application No. JP 2016-220096.
Japanese Decision to Grant dated May 3, 2021 issued in Application No. JP 2016-220096.
Taiwanese First Office Action dated Aug. 10, 2020 issued in Application No. TW 105137362.
Taiwanese Second Office Action dated Nov. 18, 2020 issued in Application No. TW 105137362.
International Search Report and Written Opinion dated Apr. 24, 2020 issued in Application No. PCT/US2019/067540.
International Preliminary Report on Patentability dated Jul. 1, 2021 issued in Application No. PCT/US2019/067540.
International Search Report and Written Opinion dated Oct. 16, 2020 issued in Application No. PCT/US2020/039615.
International Search Report and Written Opinion dated Oct. 16, 2020 issued in Application No. PCT/US2020/070187.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 8, 2020 issued in Application No. PCT/US2020/038968.
International Search Report and Written Opinion dated Apr. 10, 2020 issued in Application No. PCT/US2019/060742.
International Preliminary Report on Patentability dated May 27, 2021 issued in Application No. PCT/US2019/060742.
International Search Report and Written Opinion dated Aug. 22, 2019 issued in Application No. PCT/US2019/031618.
International Search Report and Written Opinion dated Mar. 23, 2021 issued in Application No. PCT/US2020/053856.
International Search Report and Written Opinion dated Jan. 27, 2021 issued in Application No. PCT/US2020/054730.
International Search Report and Written Opinion dated May 12, 2021 issued in Application No. PCT/US2021/012953.
International Search Report and Written Opinion dated May 17, 2021 issued in Application No. PCT/US2021/015656.
Chinese First Office Action dated May 24, 2017 issued in Application No. CN 201510053668.7.
Chinese Second Office Action dated Feb. 28, 2018 issued in Application No. CN 201510053668.7.
Japanese First Office Action dated Oct. 30, 2018 issued in Application No. JP 2015-016254.
Japanese Decision to Grant dated Feb. 12, 2019 issued in Application No. JP 2015-016254.
Korean First Office Action dated Dec. 22, 2020 issued in Application No. KR 10-2015-0015184.
Korean Second Office Action dated Jul. 27, 2021 issued in Application No. KR 10-2015-0015184.
Taiwanese First Office Action dated May 31, 2018 issued in Application No. TW 104103153.
Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.
Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.
Gerritsen et al., (Apr. 1, 1986) "Laser-generated plasma as soft x-ray source," J. Appl. Phys., 59(7):2337-2344.
McGinniss, Vincent D., ""Light Sources,"" UV Curing: Science and Technology, edited by S. Peter Pappas; Technology Marketing Corporation, 642 Westover Rd., Stamford, CT, USA; (Jan. 1, 1978), pp. 96-129.
Spitzer et al., (Mar. 1, 1986) "Conversion efficiencies from laser-produced plasmas in the extreme ultraviolet regime," J. Appl. Phys., 79(5):2251-2258.
Hench, L.L. and West, J.K., "The sol-gel process", Chemical reviews, Jan. 1, 1990; 90(1) pp. 33-72.
Hamley, I.W., "Nanostructure fabrication using block copolymers", Nanotechnology. Sep. 2003. 17;14(10):R39-R54.
Lu, Y., et al., "Continuous formation of supported cubic and hexagonal mesoporous films by sol-gel dip-coating" Nature, Sep. 1997, 389(6649), pp. 364-368.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Mackus, A.J., et al. "The use of atomic layer deposition in advanced nanopatterning", Nanoscale. Jul. 25, 2014; 6(19):10941-60.
Nazarov, D.V., et al., "Atomic layer deposition of tin dioxide nanofilms: A review", Rev. Adv. Mater. Sci. Jun. 1, 2015; 40(3):262-75.
Kwon, J., et al., "Substrate Selectivity of (tBu-Allyl)Co(CO)3 during Thermal Atomic Layer Deposition of Cobalt" Chemistry of Materials, Mar. 27, 2012; 24(6): pp. 1025-1030.
Rantala, et al., "New resist and underlayer approaches toward EUV lithography" Proc. SPIE 10809, International Conference on Extreme Ultraviolet Lithography 2018, pp. 108090X-1-108090X-8. (Oct. 11, 2018). <doi: 10.1117/12.2503107>.
Xu, et al., "Underlayer designs to enhance the performance of EUV resists" Proceedings of SPIE, vol. 7273, 2009, pp. 72731J-1-72731J-11. <doi: 10.1117/12.814223>.
U.S. Appl. No. 17/309,247, filed May 11, 2021, Weidman et al.
U.S. Appl. No. 17/310,635, filed Aug. 13, 2021, Tan et al.
CN Office Action dated Dec. 13, 2023 in CN Application No. 201810783756.6 with English translation.
CN Office Action dated Dec. 26, 2023 in CN Application No. 201980028279.5, with English Translation.
CN Office Action dated Jan. 3, 2024 in CN Application No. 202310318757.4 with English Translation.
CN Office Action dated Jan. 22, 2024 in CN Application No. 202080047683.X, with English Translation
CN Office Action dated Jan. 23, 2024 in CN Application No. 202080046943.1 with English Translation.
Dahuang, D., et al., Functional Thin Films and Their Deposition Preparation Techniques, Metallurgy Industrial Press, Jan. 31, 2013, pp. 450-454. [with English Translation].
EP Extended European Search report dated Nov. 29, 2023 in EP Application No. 23173688.5.
EP Extended European Search report dated Oct. 25, 2023, in Application No. EP21837274.6.
EP Extended European Search report dated Sep. 25, 2023, in Application No. EP20870849.5.
International Search Report and Written Opinion dated Jan. 10, 2024 in PCT Application No. PCT/US2023/033020.
International Search Report and Written Opinion dated Nov. 7, 2022 in PCT Application No. PCT/US2022/037393.
JP Office Action dated Dec. 26, 2023 in JP Application No. 20210576241, with English Translation.
JP Office Action dated Dec. 26, 2023 in JP Application No. 2021-526240, with English Translation.
JP Office Action dated Jan. 9, 2024 in JP Application No. 2023-179933, with English Translation.
JP Office Action dated Jan. 9, 2024 in JP Application No. 2023-184334 with English Translation.
JP Office Action dated Jun. 27, 2023, in application No. JP2023-63868 with English translation.
JP Office Action dated Nov. 14, 2023, in JP Application No. 2021-0575910 with English Translation.
JP Office Action dated Nov. 14, 2023 in JP Application No. 2022-559416, with English Translation.
KR Office Action dated Nov. 21, 2023 in KR Application No. 10-2022-7002869 with English Translation.
KR Office Action dated Nov. 21, 2023 in KR Application No. 10-2022-7029421 with English Translation.
KR Prior Art Search Report dated Nov. 14, 2023, in Application No. KR10-2023-7038357.
KR Search Report dated Oct. 30, 2023 in KR Application No. 10-2023-7036296.

(56) References Cited

OTHER PUBLICATIONS

TW Office Action dated Dec. 20, 2023, in TW Application No. 109121579 with English Translation.
TW Office Action dated Jan. 2, 2024 in TW Application No. 109121639, with English Translation.
TW Office Action dated Jan. 11, 2024 in TW Application No. 108146890, with English Translation.
TW Office Action dated Oct. 13, 2023, in application No. TW109121680 with English Translation.
TW Office Action dated Oct. 30, 2023, in application No. TW108116155 with English Translation.
U.S. Final Office Action dated Nov. 9, 2023 in U.S. Appl. No. 17/455,185.
U.S. Non-Final Office Action dated Nov. 20, 2023 in U.S. Appl. No. 18/377,245.
U.S. Notice of Allowance dated Dec. 4, 2023 in U.S. Appl. No. 17/452,365.
U.S. Restriction Requirement dated Nov. 20, 2023 in U.S. Appl. No. 17/759,281.
CN Office Action dated Jul. 23, 2024 in CN Application No. 201810783756.6 with English translation.
International Preliminary Report on Patentability and Written Opinion dated Dec. 28, 2023 in PCT Application No. PCT/US2022/033488.
International Preliminary Report on Patentability and Written Opinion dated Jun. 27, 2024 in PCT Application No. PCT/US2022/081376.
International Preliminary Report on Patentability and Written Opinion dated Jun. 27, 2024 in PCT Application No. PCT/US2022/081390.
International Preliminary Report on Patentability and Written Opinion dated Jun. 27, 2024 in PCT Application No. PCT/US2022/081845.
International Search Report and Written Opinion dated Jul. 4, 2024 in PCT Application No. PCT/US2024/019555.
International Search Report and Written Opinion dated Oct. 17, 2022 in PCT Application No. PCT/US2022/033488.
JP Notice of Allowances dated Aug. 27, 2024 in JP Application No. 2022-559416 with English translation.
JP Notice of Allowances dated Sep. 3, 2024 in JP Application No. 2023-63868 with English translation.
KR Notice of Allowance dated Aug. 1, 2024 in KR Application No. 10-2024-7012307, with English Translation.
KR Office Action dated Jul. 12, 2024 in KR Application No. 10-2022-7029421 with English translation.
KR Office Action dated Jul. 12, 2024 in KR Application No. 10-2023-7036296 with English translation.
KR Office Action dated Jun. 24, 2024 in KR Application No. 10-2022-7002869, with English Translation.
TW Office Action dated Jul. 2, 2024 in TW Application No. 109134940 with English translation.
TW Office Action dated Jul. 9, 2024 in TW Application No. 110111086 with English translation.
TW Office Action dated Jun. 27, 2024 in TW Application No. 113107490 with English translation.
U.S. Advisory Action dated Jun. 24, 2024 in U.S. Appl. No. 18/377,245.
U.S. Advisory Action dated May 7, 2024 in U.S. Appl. No. 18/298,003.
U.S. Advisory Action dated Sep. 3, 2024 in U.S. Appl. No. 18/377,267.
U.S. Advisory Action dated Sep. 5, 2024 in U.S. Appl. No. 17/759,281.
U.S. Corrected Notice of Allowance dated Aug. 29, 2024 in U.S. Appl. No. 17/596,648.
U.S. Final Office Action dated Jun. 21, 2024 in U.S. Appl. No. 18/377,267.
U.S. Final Office Action dated Jun. 27, 2024 in U.S. Appl. No. 17/759,281.
U.S. Non-Final Office Action dated Jun. 21, 2024 in U.S. Appl. No. 17/596,648.
U.S. Non-Final Office Action dated May 29, 2024 in U.S. Appl. No. 18/298,003.
U.S. Notice of Allowance dated Aug. 7, 2024 in U.S. Appl. No. 18/184,545.
U.S. Notice of Allowance dated Aug. 16, 2024 in U.S. Appl. No. 17/596,648.
U.S. Notice of Allowance dated Sep. 9, 2024 in U.S. Appl. No. 18/184,545.
U.S. Appl. No. 18/569,213, inventors Kanakasabapathy S K, et al., filed Dec. 11, 2023.
U.S. Restriction requirement dated Aug. 30, 2024 in U.S. Appl. No. 18/700,238.
Alf, M.E., et al., "Chemical Vapor Deposition of Conformal, Functional, and Responsive Polymer Films," Advanced Materials, 2010, vol. 22(18), pp. 1993-2027.
CN Office Action dated Apr. 22, 2024 in CN Application No. 201980085227.1 with English translation.
CN Office Action dated Apr. 24, 2024 in CN Application No. 201980075389.7 with English translation.
CN Office Action dated Mar. 14, 2024 in CN Application No. 201810783756.6, with English Translation.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.
International Search Report and Written Opinion dated Feb. 1, 2024 in PCT Application No. PCT/US2023/034545.
JP Office Action dated Apr. 2, 2024 in JP Application No. 2022-559416, with English Translation.
JP Office Action dated Apr. 30, 2024 in JP Application No. 2021-577241 with English translation.
JP Office Action dated Feb. 13, 2024 in JP Application No. 2023-63868, with English Translation.
JP Office Action dated Mar. 5, 2024 in JP Application No. 2021-575910, with English Translation.
JP Office Action dated Mar. 22, 2024 in JP Application No. 2020-562160, with English Translation.
JP Office Action dated Mar. 26, 2024 in JP Application No. 2021-576240, with English Translation.
KR Office Action dated Apr. 5, 2024 in KR Application No. 10-2021-7036139, with English Translation.
KR Office Action dated Apr. 9, 2024 in KR Application No. 10-2023-7038357 with English Translation.
KR Office Action dated Apr. 23, 2024 in KR Application No. 10-2016-0152489 with English translation.
KR Office Action dated Feb. 29, 2024 in KR Application No. 10-2022-7026649, with English Translation.
KR Office Action dated Mar. 14, 2024 in KR Application No. 10-2021-7022858, with English Translation.
KR Prior Art Search Report dated Apr. 3, 2023, in application No. KR 10-2022-7029421 with English translation.
KR Prior Art Search Report dated Aug. 25, 2023, in Application No. KR10-2021-7022858 with English translation.
KR Prior Art Search Report dated Nov. 14, 2023, in Application No. KR10-2023-7038357 with English translation.
KR Prior Art Search Report dated Oct. 30, 2023 in KR Application No. 10-2023-7036296 with English translation.
SG Written Opinion dated Apr. 16, 2024 in SG Application No. 11202114197Y.
Singapore Search Report and Written Opinion dated Mar. 17, 2023 issued in Application No. SG11202114197Y.
TW Office Action dated Apr. 19, 2024 in TW Application No. 112146727 with English translation.
TW Office Action dated Apr. 22, 2024 in TW Application No. 112126160 with English translation.
TW Office Action dated Feb. 21, 2024 in TW Application No. 109121664 with English translation.
TW Office Action dated Feb. 29, 2024 in TW Application No. 109134377, with English Translation.
TW Office Action dated Mar. 11, 2024 in TW Application No. 109121649, with English Translation.

(56) References Cited

OTHER PUBLICATIONS

TW Office Action dated Mar. 21, 2024 in TW Application No. 108146890, with English Translation.
U.S. Advisory Action dated Apr. 16, 2024 in U.S. Appl. No. 17/596,648.
U.S. Corrected Notice of Allowance dated Jan. 31, 2024 in U.S. Appl. No. 17/309,247.
U.S. Final Office Action dated Apr. 10, 2024 in U.S. Appl. No. 15/733,598.
U.S. Final Office Action dated Apr. 23, 2024 in U.S. Appl. No. 17/596,928.
U.S. Final Office Action dated Feb. 27, 2024 in U.S. Appl. No. 18/298,003.
U.S. Final Office Action dated Mar. 5, 2024 in U.S. Appl. No. 17/596,648.
U.S. Final Office Action dated Mar. 12, 2024 in U.S. Appl. No. 18/377,245.
U.S. Final Office Action dated Mar. 14, 2024 in U.S. Appl. No. 17/596,651.
U.S. Final Office Action dated May 3, 2024 in U.S. Appl. No. 18/297,989.
U.S. Non-Final Office Action dated Feb. 1, 2024 in U.S. Appl. No. 17/759,281.
U.S. Non-Final Office Action dated Mar. 4, 2024 in U.S. Appl. No. 17/758,125.
U.S. Non-Final Office Action dated Mar. 4, 2024 in U.S. Appl. No. 18/377,267.
U.S. Notice of Allowance dated Mar. 6, 2024 in U.S. Appl. No. 18/184,545.
U.S. Notice of Allowance dated Mar. 13, 2024 in U.S. Appl. No. 18/184,545.
U.S. Notice of Allowance dated Mar. 15, 2024 in U.S. Appl. No. 17/452,365.
U.S. Appl. No. 18/580,334, inventors Peter D, et al., filed Jan. 18, 2024.
U.S. Appl. No. 18/628,111, inventors Tan S.S, et al., filed Apr. 5, 2024.
U.S. Restriction Requirement dated Apr. 8, 2024 in U.S. Appl. No. 17/754,019.
CN Office Action dated Sep. 14, 2024 in CN Application No. 202310318757.4 with English translation.
CN Office Action dated Sep. 23, 2024 in CN Application No. 202080046943.1 with English translation.
SG Written Opinion dated Aug. 30, 2024 in SG Application No. 11202114183P.
U.S. Non-Final Office Action dated Oct. 9, 2024 in U.S. Appl. No. 18/377,245.
U.S. Appl. No. 18/850,628, inventors Li D, et al., filed Sep. 25, 2024.
U.S. Appl. No. 18/850,990, inventors Lee Y, et al., filed Sep. 25, 2024.
KR Notice of Allowances dated Oct. 16, 2024 in KR Application No. 10-2022-7002869 with English Translation.
U.S. Appl. No. 18/855,026, inventors Lee Y, et al., filed Oct. 8, 2024.
U.S. Restriction requirement dated Oct. 30, 2024 in U.S. Appl. No. 18/769,038.
U.S. Restriction requirement dated Oct. 30, 2024 in U.S. Appl. No. 18/769,048.
International Preliminary Report on Patentability and Written Opinion dated Nov. 14, 2024 in PCT Application No. PCT/US2023/019871.
International Search Report and Written Opinion dated Nov. 20, 2024 in PCT Application No. PCT/US2024/039915.
JP Office Action dated Nov. 12, 2024 in JP Application No. 2024-522188 with English translation.
KR Office Action dated Nov. 28, 2024 in KR Application No. 10-2022-7014896, with English Translation.
TW Office Action dated Nov. 26, 2024 in TW Application No. 110126445, with English Translation.
U.S. Appl. No. 18/932,475, inventors Marks J, et al., filed Oct. 30, 2024.
U.S. Restriction requirement dated Nov. 14, 2024 in U.S. Appl. No. 18/700,238.
U.S. Supplemental Notice of Allowance dated Nov. 15, 2024 in U.S. Appl. No. 18/184,545.

\* cited by examiner

DRY DEVELOPMENT OF RESISTS

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Patterning of thin films in semiconductor processing is often an important step in the fabrication of semiconductors. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

SUMMARY

Dry development of resists can be useful, for example, to form a patterning mask in the context of high-resolution patterning. According to some aspects of this disclosure, dry development may be advantageously accomplished by a method of processing a semiconductor substrate including providing in a process chamber a photopatterned resist on a substrate layer on a semiconductor substrate, and dry developing the photopatterned resist by removing either an exposed portion or an unexposed portion of the resist by a dry development process comprising exposure to a chemical compound to form a resist mask. In some embodiments, the resist may be an EUV-sensitive organo-metal oxide or organo-metal-containing thin film EUV resist.

In some embodiments of the disclosure, a suitable resist may be an EUV resist that is vapor-deposited on the substrate layer. In other embodiments, a suitable resist may be an EUV resist that is spin-coated on the substrate layer. In some embodiments, the EUV resist may be an organotin oxide. In some embodiments, the dry development process may include a plasma. In other embodiments, the dry development process may be a plasma-free thermal process.

In some embodiments, the dry development process may involve exposure to a compound comprising RxZy, where R=B, Al, Si, C, S, SO with x>0 and Z=Cl, H, Br, F, $CH_4$ and y>0 at a suitable flow rate for a suitable time, pressure and temperature.

In some embodiments, the photopatterned EUV-resist is an organotin oxide-containing 10-20 nm thick thin film deposited based on a gas phase reaction of the organotin precursor isopropyl(tris)(dimethylamino)tin and water vapor subjected to a EUV exposure dose and post-exposure bake, and the dry development process involves a non-plasma thermal exposure of the photopatterned EUV-resist at 120° C., 10 mT, 500 sccm $BCl_3$, for 30 seconds.

In some embodiments, the process further involves after dry developing to form the resist mask, etching the substrate layer using the resist mask.

In some embodiments, the resist is sensitive to a radiation source selected from the group consisting of DUV, EUV, X-ray and e-beam radiation.

In other aspects, an apparatus for conducting dry development of a patterned resist is provided. Such an apparatus may include a vacuum process chamber with a substrate (e.g., wafer) support, a vacuum line, a dry development chemistry gas line, one or more heaters for substrate temperature control; and a controller programmed with instructions for processing a semiconductor substrate. The instructions may include code for providing to the vacuum process chamber a patterned resist on a substrate layer on a semiconductor substrate, and removing either an exposed portion or an unexposed portion of the patterned resist by a dry development process comprising exposure to a chemical compound to form a resist mask.

In some embodiments, the process chamber interior of the apparatus may be coated with a corrosion inhibitor.

In some embodiments, the controller may be programmed with instructions for the dry development process wherein the dry development process includes a plasma. In other embodiments, the controller may be programmed with instructions for the dry development process wherein the dry development process is a plasma-free thermal process.

In some embodiments, the controller may be programmed with instructions for the dry development process wherein the dry development process involves exposure to a compound comprising RxZy, where R=B, Al, Si, C, S, SO with x>0 and Z=Cl, H, Br, F, $CH_4$ and y>0 at a suitable flow rate for a suitable time, pressure and temperature.

In some embodiments, the controller may be programmed with instructions for the dry development process wherein the photopatterned EUV-resist is an organotin oxide-containing 10-20 nm thick thin film deposited based on a gas phase reaction of the organotin precursor isopropyl(tris) (dimethylamino)tin and water vapor subjected to a EUV exposure dose and post-exposure bake, and the dry development process involves a non-plasma thermal exposure of the photopatterned EUV-resist at 120° C., 10 mT, 500 sccm $BCl_3$, for 30 seconds.

In some embodiments, the controller may be programmed wherein the process further involves after dry developing to form the resist mask, etching the substrate layer using the resist mask.

DETAILED DESCRIPTION

Figure 1A:
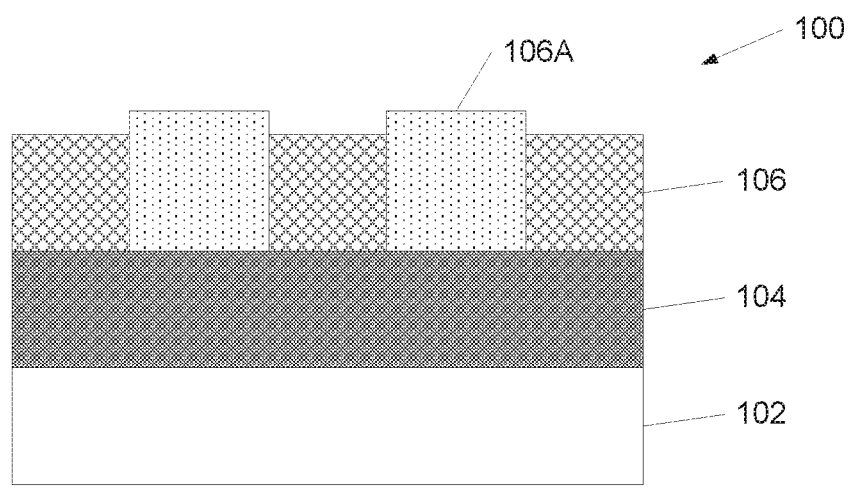
FIGS. 1A-B and 2 illustrate processing stages and result of a negative tone dry development according to a particular embodiment of the present disclosure.

This disclosure relates generally to the field of semiconductor processing. In particular aspects, the disclosure is directed to process and apparatus for dry development of photoresists (e.g., EUV, DUV, X-ray or e-beam-sensitive metal and/or metal oxide-containing photoresists), for example to form a patterning mask in the context of EUV patterning.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, and so operates in a vacuum. Similar beneficial performance may be obtainable with other forms of radiation, including DUV, X-ray or e-beam radiation. While the description herein primarily references EUV as the resist irradiation source, it should be understood that these other forms of radiation are also contemplated in alternative embodiments.

EUV lithography makes use of EUV resists that are patterned to form masks for use in etching underlying layers. EUV resists may be polymer-based chemically amplified resists (CARs) produced by liquid-based spin-on techniques. An alternative to CARs are directly photopatternable metal oxide-containing films, such as those available from Inpria Corporation, Corvallis, OR, and described, for example, in US Patent Publications US 2017/0102612, US 2016/021660 and US 2016/0116839, incorporated by reference herein at least for their disclosure of photopatternable metal oxide-containing films. Such films may be produced by spin-on techniques or dry vapor-deposited. The metal oxide-containing film can be patterned directly (i.e., without the use of a separate photoresist) by EUV exposure in a vacuum ambient providing sub-30 nm patterning resolution, for example as described in U.S. Pat. No. 9,996,004, issued Jun. 12, 2018 and titled EUV PHOTOPATTERNING OF VAPOR-DEPOSITED METAL OXIDE-CONTAINING HARDMASKS, and/or PCT/US19/31618, filed May 9, 2019 and titled METHODS FOR MAKING EUV PATTERNABLE HARD MASKS, and/or PCT/US2019/060742, filed Nov. 11, 2019 and titled METHODS FOR MAKING HARD MASKS USEFUL IN NEXT-GENERATION LITHOGRAPHY, the disclosures of which at least relating to the composition, deposition and patterning of directly photopatternable metal oxide films to form EUV resist masks is incorporated by reference herein. Generally, the patterning involves exposure of the EUV resist with EUV radiation to form a photo pattern in the resist, followed by development to remove a portion of the resist according to the photo pattern to form the mask.

Directly photopatternable EUV resists may be composed of or contain metals and/or metal oxides mixed within organic components. The metals/metal oxides are highly promising in that they can enhance the EUV photon adsorption and generate secondary electrons and/or show increased etch selectivity to an underlying film stack and device layers. Up to date, these resists have been developed using a wet (solvent) approach, which requires the wafer to move to the track, where it is exposed to developing solvent, dried and baked. This wet development step does not only limit productivity but can also lead to line collapse due to surface tension effects and/or delamination.

In one implementation of the present disclosure, a EUV-sensitive metal oxide-containing film, e.g., an organotin oxide, is vapor-deposited on a semiconductor substrate. The metal oxide-containing film is then patterned directly by EUV exposure in a vacuum ambient, and the pattern is developed to form the metal oxide-containing mask. As described herein, the development of the organo-metal oxide-containing, organo-metal-containing, or other directly photopatternable EUV resist film is conducted by a dry method.

The presently disclosed methods and apparatus provide a general approach that may be applied in various specific implementations. Embodiments of this disclosure provide a process and apparatus configured for dry development of an EUV-photopatterned metal and/or metal oxide-containing resist using a chemical compound as part of a EUV resist mask formation process. Other embodiments include combining all dry steps of film formation by vapor deposition, (EUV) lithographic photopatterning and dry development. Dry development can improve performance (e.g., prevent line collapse due to surface tension and delamination in wet development) and enhance throughput (e.g., by avoiding wet development track). Other advantages may include eliminating the use of organic solvent developers, reduced sensitivity to adhesion issues, and a lack of solubility-based limitations.

According to particular embodiments, a dry method for the development of EUV-sensitive metal and/or metal oxide containing photoresists is provided. One embodiment applies to the dry development of Sn and SnOx (tin oxide)-based resists, containing some amount of C, H and O (and possibly additional components such as F). In various embodiments, the metal oxide-containing film may be a photosensitive metalorganic oxide film, such as an organotin oxide, for example an alkyltin oxide (oxide/hydroxide) $RSnO_xOH_{(3-x)}$. Effective compositions include those in which the alkyl substituent is a tert-butyl or iso-propyl substituent in which the carbon atom bonded to the tin atom is bonded to three or two (respectively) other carbon atoms. Such substituents appear to undergo more efficient cleavage on exposure to EUV light resulting in changes allowing pattern development. In various embodiments, the EUV exposure causes loss of the alkyl substituent with formation of a new Sn—O—Sn crosslink, which may occur after the EUV exposure step, for example during a post-exposure bake step during which the film may be exposed to ambient oxygen and/or moisture.

The development can be done by using either a gentle plasma (high pressure, low power) or a thermal process while flowing a dry development chemistry such as $BCl_3$ or another Lewis Acid, for example. According to a particular embodiment, $BCl_3$ is able to quickly remove the unexposed material, leaving behind a pattern of the exposed film that can be transferred into the underlying layers by plasma-based etch processes, for example conventional etch processes.

In a dry development process using a gentle plasma or a thermal process (e.g., >5 mT (e.g., >15 mT)/<1000 W (e.g., <500 W) transformer coupled plasma (TCP), (in other embodiments CCP, ICP or downstream plasma may be used), 0 to 300° C. (e.g., 30 to 120° C.), 100 to 1000 sccm (e.g., about 500 sccm) dry development chemistry, for 1 to 3000 seconds (e.g., 10-600 seconds) in accordance with this disclosure, a wafer may directly go to a dry development/etch chamber following photopatterning in an EUV scanner, and skip the material and productivity costs associated with a wet development on the track. Alternatively, a post exposure bake step during which the exposed regions undergo further crosslinking to form a denser $SnO_2$-like network may be conducted in the development chamber, or another chamber. A dry process can provide more tunability and give further critical dimension (CD) control and scum removal.

By applying a non-plasma thermal approach, productivity can be significantly improved as multiple wafers can be batch developed, at the same time in a low-cost thermal vacuum chamber/oven. A suitable chamber can include a vacuum line, a dry development chemistry gas (e.g., $BCl_3$) line, and heaters for temperature control. And due to the process being thermal, the chamber interior can be coated with corrosion resistant films, such as organic polymers (such as polytetrafluoroethylene (PTFE), e.g., Teflon™) or inorganic coatings, without risk of removal by plasma exposure.

In various embodiments, the photoresist containing some amount of metal, metal oxide and organic components can be dry developed by a plasma or thermal, plasma (including possibly photoactivated (i.e., lamp-heated, such as UV lamp heated) or a mixture of methods while flowing a dry development gas including a compound of formula RxZy, where R=B, Al, Si, C, S, SO with x>0 and Z=Cl, H, Br, F, $CH_4$ and y>0.

The dry development can result in a positive or a negative tone, in which the RxZy species selectively removes either the unexposed or the exposed material, leaving behind the exposed or unexposed counterpart as a mask.

The process has been demonstrated for EUV photoresist compositions based on organotin oxides, being applicable to both commercially available spin-coatable formulations, such as are available from Inpria Corporation, and formulations applied using dry vacuum deposition techniques, such as are described in Applicant's prior filings referenced above. Negative tone dry development has been achieved by the selective dry development (removal) of non-EUV exposed regions exposed to flows of $BCl_3$ without striking a plasma. One specific example of a process for dry development involves an organotin oxide-containing EUV-sensitive resist thin film (e.g., 10-20 nm thick) that is deposited based on a gas phase reaction of the organotin precursor isopropyl (tris)(dimethylamino)tin and water vapor, subjected to a EUV exposure dose and post-exposure bake, and then dry developed using a non-plasma thermal process at 120° C. 10, mT, 500 sccm $BCl_3$, for 30 seconds.

Figure 1B:
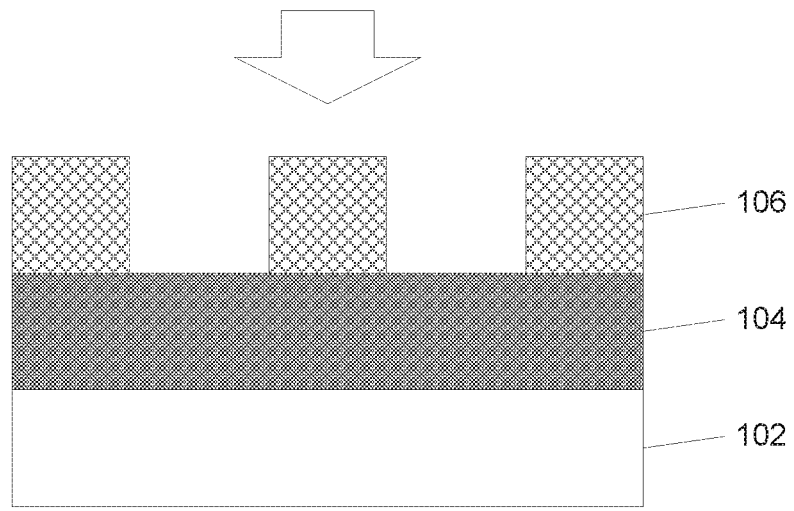
Figure 2:
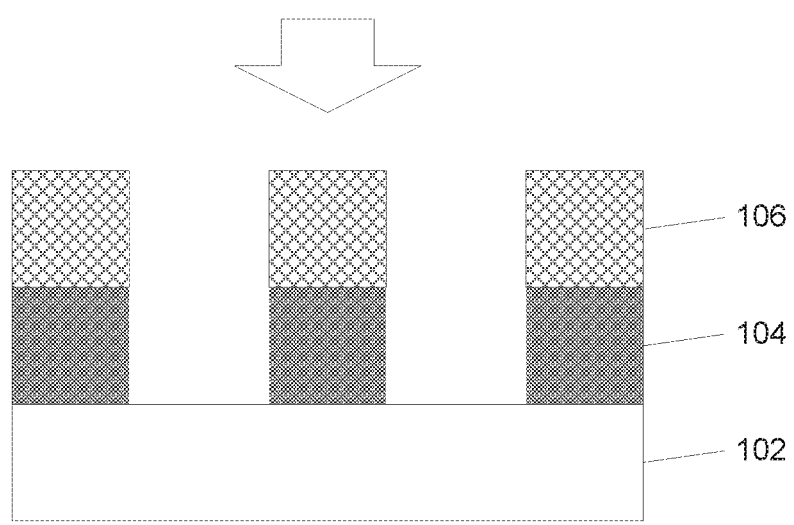

Referring to FIGS. 1A-B and 2, negative tone dry development according to a particular embodiment of the present disclosure is illustrated. As shown in FIG. 1A, a wafer 100, including a substrate 102 (e.g., Si) layer, a layer to be etched 104 (e.g., an ashable hardmask, e.g., siliconoxycarbide (SOC)), or other material, e.g., silicon, silicon oxide, silicon nitride, etc.; in other embodiments may be a layer stack) disposed on the substrate, and a photopatterned EUV resist thin film 106 (e.g., 10-20 nm thick organotin oxide-containing layer disposed on the layer to be etched) can be provided to an etch chamber following photopatterning in an EUV scanner and optional baking as described above. As shown in FIG. 1B, non-EUV exposed regions 106a (darker portions in the figure) of the resist 106 can be removed in a dry development process by exposure to flows of dry development chemistry, such as $BCl_3$, without striking a plasma. Thereafter, the layer to be etched 104 may be etched using the developed resist 106 as a mask to provide the structure depicted in FIG. 2.

Alternate Embodiment

Metal and metal oxide-containing EUV-sensitive resists, such as described above, are being adopted in EUV patterning due to their enhanced adsorption of EUV photons. But challenges include high line width and edge roughness, and scumming issues. Both of these challenges can be largely attributed to stochastics and the non-optimal Gaussian distribution of the light resulting in partially or fully exposed material in areas where the resist should remain unexposed or vice versa.

Wet development has very high selectivity and has been shown to exhibit clear on/off behavior, resulting in inability of a wet development process to remove areas that were mistakenly partially or fully exposed. The remaining residues are then left after the wet development process, resulting in scumming and high line edge and width roughness. Interestingly, due to the tunability of the dry development process in which the etch rate and selectivity can be tuned based on multiple knobs, (e.g., time, temperature, pressure, gas/flow) it can be further applied to descum and smooth metal containing resist lines by removing these partially exposed residues.

Apparatus

As noted above, a suitable process chamber for implementation of a non-plasma thermal embodiment of this disclosure may be composed of a vacuum process chamber with a substrate (e.g., wafer) support, a vacuum line, a $BCl_3$ line, and one or more heaters for temperature control. The non-plasma thermal process chamber interior can be coated with corrosion resistant organic polymers (such as polytetrafluoroethylene (PTFE), e.g., Teflon™), without risk of removal by plasma exposure.

Figure 3:
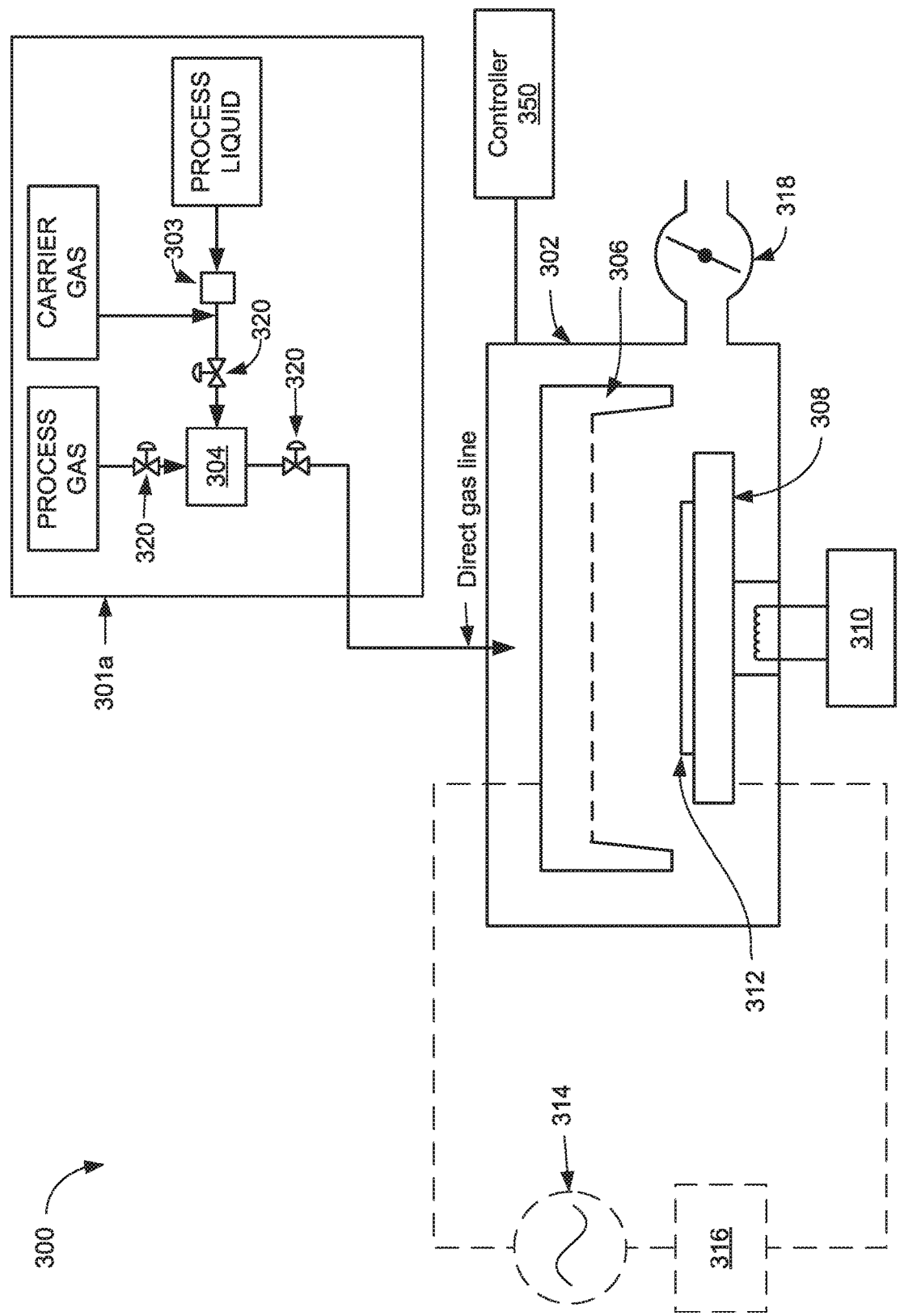
FIG. 3 depicts a schematic illustration of an embodiment of process station apparatus suitable for implementation of described dry development embodiments.
Figure 4:
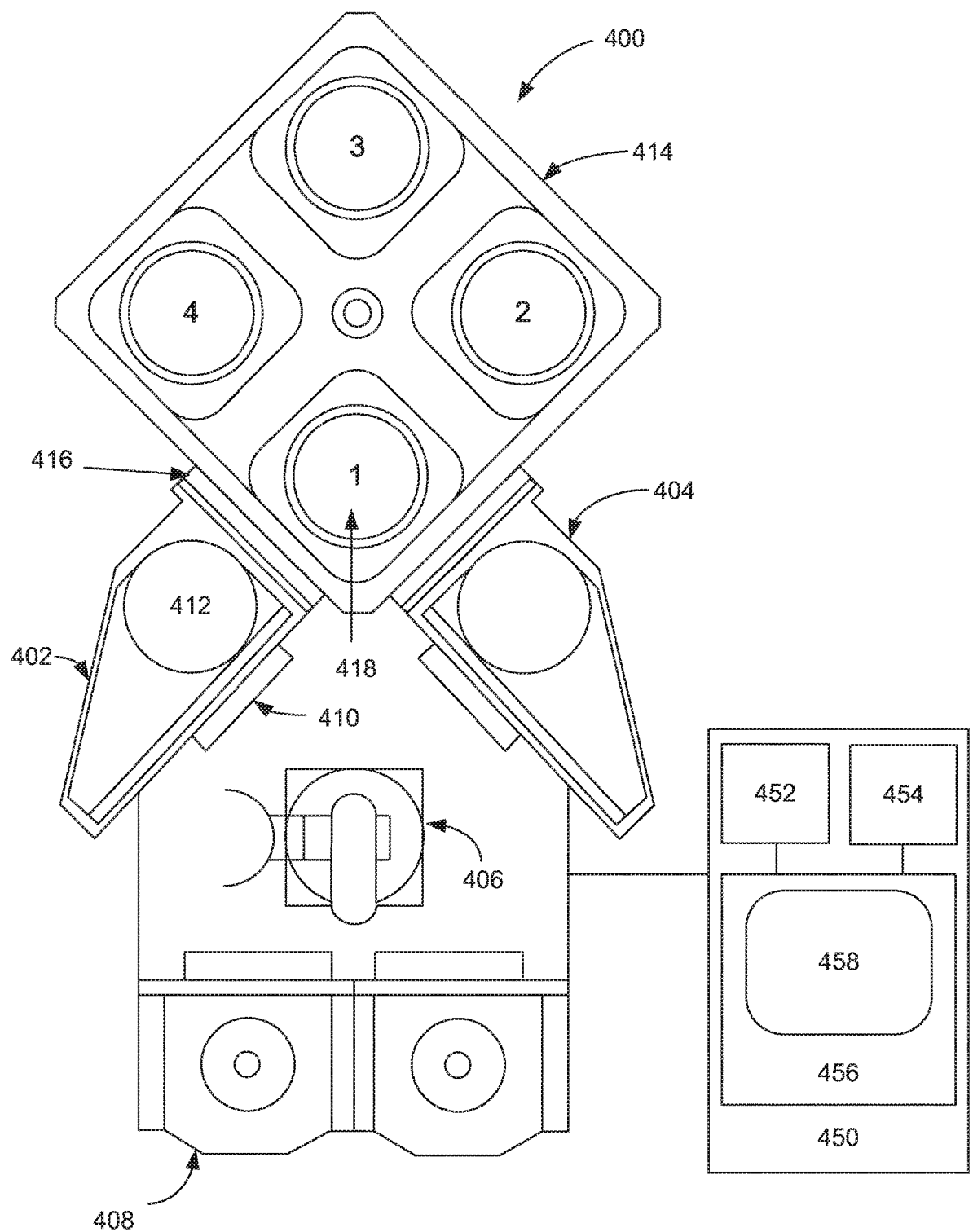
FIG. 4 depicts an embodiment of a multi-station processing tool suitable for implementation of described dry development embodiments.

FIG. 3 depicts a schematic illustration of an embodiment of process station 300 having a process chamber body 302 for maintaining a low-pressure environment that is suitable for implementation of described dry development embodiments. A plurality of process stations 300 may be included in a common low pressure process tool environment. For example, FIG. 4 depicts an embodiment of a multi-station processing tool 400, such as a VECTOR® processing tool available from Lam Research Corporation, Fremont, CA In some embodiments, one or more hardware parameters of the process station 300 including those discussed in detail below may be adjusted programmatically by one or more computer controllers 350.

A process station may be configured as a module in a cluster tool. FIG. 6 depicts a semiconductor process cluster tool architecture with vacuum-integrated deposition and patterning modules suitable for implementation of the embodiments described herein. Such a cluster process tool architecture can include resist deposition, resist exposure (EUV scanner), resist dry development and etch modules, as described above and further below with reference to FIGS. 5 and 6.

In some embodiments, certain of the processing functions can be performed consecutively in the same module, for example dry development and etch. And embodiments of this disclosure are directed to methods and apparatus for receiving a wafer, including a photopatterned EUV resist thin film layer disposed on a layer or layer stack to be etched, to a dry development/etch chamber following photopatterning in an EUV scanner; dry developing photopatterned EUV resist thin film layer; and then etching the underlying layer using the patterned EUV resist as a mask, as described herein.

Returning to FIG. 3, process station 300 fluidly communicates with reactant delivery system 301a for delivering process gases to a distribution showerhead 306. Reactant delivery system 301a optionally includes a mixing vessel 304 for blending and/or conditioning process gases, for delivery to showerhead 306. One or more mixing vessel inlet valves 320 may control introduction of process gases to mixing vessel 304. Where plasma exposure is used, plasma may also be delivered to the showerhead 306 or may be generated in the process station 300. As noted above, in at least some embodiments, non-plasma thermal exposure is favored.

FIG. 3 includes an optional vaporization point 303 for vaporizing liquid reactant to be supplied to the mixing vessel 304. In some embodiments, a liquid flow controller (LFC) upstream of vaporization point 303 may be provided for controlling a mass flow of liquid for vaporization and delivery to process station 300. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM.

Showerhead 306 distributes process gases toward substrate 312. In the embodiment shown in FIG. 3, the substrate 312 is located beneath showerhead 306 and is shown resting on a pedestal 308. Showerhead 306 may have any suitable shape, and may have any suitable number and arrangement of ports for distributing process gases to substrate 312.

In some embodiments, pedestal 308 may be raised or lowered to expose substrate 312 to a volume between the substrate 312 and the showerhead 306. It will be appreciated that, in some embodiments, pedestal height may be adjusted programmatically by a suitable computer controller 350.

In some embodiments, pedestal 308 may be temperature controlled via heater 310. In some embodiments, the pedestal 308 may be heated to a temperature of greater than 0° C. and up to 300° C. or more, for example 50 to 120° C., such as about 65 to 80° C., during non-plasma thermal exposure of a photopatterned resist to dry development chemistry, such as $BCl_3$, as described in disclosed embodiments.

Further, in some embodiments, pressure control for process station 300 may be provided by a butterfly valve 318. As shown in the embodiment of FIG. 3, butterfly valve 318 throttles a vacuum provided by a downstream vacuum pump (not shown).

However, in some embodiments, pressure control of process station 300 may also be adjusted by varying a flow rate of one or more gases introduced to the process station 300.

In some embodiments, a position of showerhead 306 may be adjusted relative to pedestal 308 to vary a volume between the substrate 312 and the showerhead 306. Further, it will be appreciated that a vertical position of pedestal 308 and/or showerhead 306 may be varied by any suitable mechanism within the scope of the present disclosure. In some embodiments, pedestal 308 may include a rotational axis for rotating an orientation of substrate 312. It will be appreciated that, in some embodiments, one or more of these example adjustments may be performed programmatically by one or more suitable computer controllers 350.

Where plasma may be used, for example in gentle plasma-based dry development embodiments and/or etch operations conducted in the same chamber, showerhead 306 and pedestal 308 electrically communicate with a radio frequency (RF) power supply 314 and matching network 316 for powering a plasma. In some embodiments, the plasma energy may be controlled by controlling one or more of a process station pressure, a gas concentration, an RF source power, an RF source frequency, and a plasma power pulse timing. For example, RF power supply 314 and matching network 316 may be operated at any suitable power to form a plasma having a desired composition of radical species. Examples of suitable powers are up to about 500 W.

In some embodiments, instructions for a controller 350 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a recipe phase may include instructions for setting a flow rate of a dry development chemistry reactant gas, such as $BCl_3$, and time delay instructions for the recipe phase. In some embodiments, the controller 350 may include any of the features described below with respect to system controller 450 of FIG. 4.

As described above, one or more process stations may be included in a multi-station processing tool. FIG. 4 shows a schematic view of an embodiment of a multi-station processing tool 400 with an inbound load lock 402 and an outbound load lock 404, either or both of which may include a remote plasma source. A robot 406 at atmospheric pressure is configured to move wafers from a cassette loaded through a pod 408 into inbound load lock 402 via an atmospheric port 410. A wafer is placed by the robot 406 on a pedestal 412 in the inbound load lock 402, the atmospheric port 410 is closed, and the load lock is pumped down. Where the inbound load lock 402 includes a remote plasma source, the wafer may be exposed to a remote plasma treatment to treat the silicon nitride surface in the load lock prior to being introduced into a processing chamber 414. Further, the wafer also may be heated in the inbound load lock 402 as well, for example, to remove moisture and adsorbed gases. Next, a chamber transport port 416 to processing chamber 414 is opened, and another robot (not shown) places the wafer into the reactor on a pedestal of a first station shown in the reactor for processing. While the embodiment depicted in FIG. 4 includes load locks, it will be appreciated that, in some embodiments, direct entry of a wafer into a process station may be provided.

The depicted processing chamber 414 includes four process stations, numbered from 1 to 4 in the embodiment shown in FIG. 4. Each station has a heated pedestal (shown at 418 for station 1), and gas line inlets. It will be appreciated that in some embodiments, each process station may have different or multiple purposes. For example, in some embodiments, a process station may be switchable between dry development and etch process modes. Additionally or alternatively, in some embodiments, processing chamber 414 may include one or more matched pairs of dry development and etch process stations. While the depicted processing chamber 414 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 4 depicts an embodiment of a wafer handling system 490 for transferring wafers within processing chamber 414. In some embodiments, wafer handling system 490 may transfer wafers between various process stations and/or between a process station and a load lock. It will be appreciated that any suitable wafer handling system may be employed. Non-limiting examples include wafer carousels and wafer handling robots. FIG. 4 also depicts an embodiment of a system controller 450 employed to control process conditions and hardware states of process tool 400. System controller 450 may include one or more memory devices 456, one or more mass storage devices 454, and one or more processors 452. Processor 452 may include a CPU or computer, analog, and/or digital input/output connections, stepper motor controller boards, etc.

In some embodiments, system controller 450 controls all of the activities of process tool 400. System controller 450 executes system control software 458 stored in mass storage device 454, loaded into memory device 456, and executed on processor 452.

Alternatively, the control logic may be hard coded in the controller 450. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 458 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 400. System control software 458 may be configured in any suitable way. For example, various process tool component subroutines or control objects may be written to control operation of the process tool components used to carry out various process tool processes. System control software 458 may be coded in any suitable computer readable programming language.

In some embodiments, system control software 458 may include input/output control (IOC) sequencing instructions for controlling the various parameters described above. Other computer software and/or programs stored on mass storage device 454 and/or memory device 456 associated with system controller 450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 418 and to control the spacing between the substrate and other parts of process tool 400.

A process gas control program may include code for controlling gas composition (e.g., $BCl_3$ gas as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 450. The user interface may include a display screen, graphical software displays of the apparatus and/or process conditions, and user input devices such as pointing devices, keyboards, touch screens, microphones, etc.

In some embodiments, parameters adjusted by system controller 450 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 450 from various process tool sensors. The signals for controlling the process may be output on the analog and digital output connections of process tool 400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 450 may provide program instructions for implementing the above-described deposition processes. The program instructions may control a variety of process parameters, such as DC power level, RF bias power level, pressure, temperature, etc. The instructions may control the parameters to operate dry development and/or etch processes according to various embodiments described herein.

The system controller 450 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 450.

In some implementations, the system controller 450 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate.

The electronics may be referred to as the "controller," which may control various components or subparts of the system or systems. The system controller 450, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 450 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 450 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 450, in some implementations, may be a part of or coupled to a computer that is integrated with, coupled to the system, otherwise networked to the system, or a combination thereof. For example, the system controller 450 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 450 receives instructions in the form of data, which specify parameters for each of the processing steps to be performed during one or more operations.

It should be understood that the parameters may be specific to the type of process to be performed and the type of tool that the system controller 450 is configured to interface with or control. Thus as described above, the system controller 450 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the system controller 450 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Inductively coupled plasma (ICP) reactors which, in certain embodiments, may be suitable for etch operations suitable for implementation of some embodiments, are now described. Although ICP reactors are described herein, in some embodiments, it should be understood that capacitively coupled plasma reactors may also be used.

Figure 5:
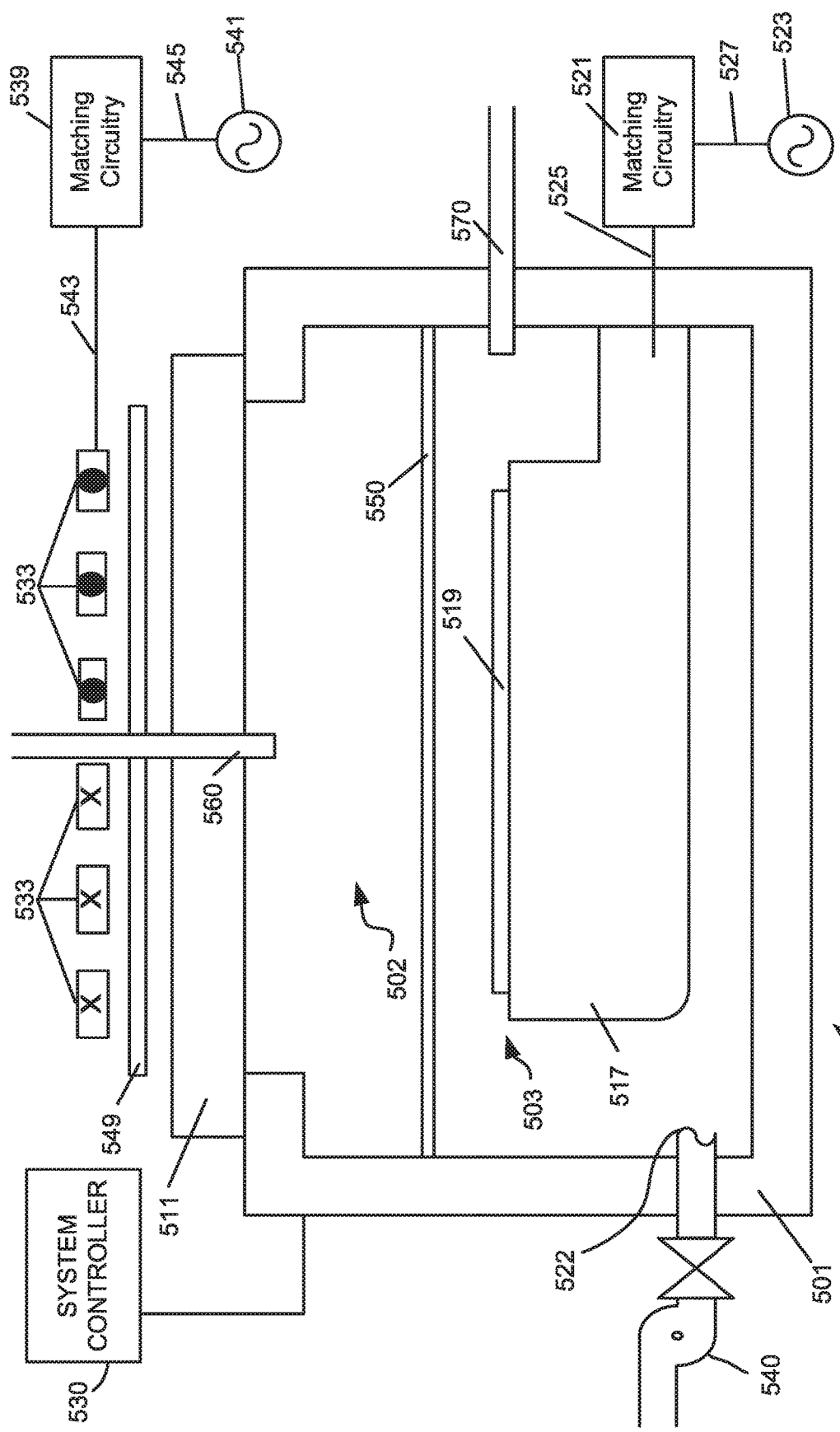
FIG. 5 schematically shows a cross-sectional view of an inductively coupled plasma apparatus appropriate for implementing certain embodiments or aspects of embodiments.
Figure 6:
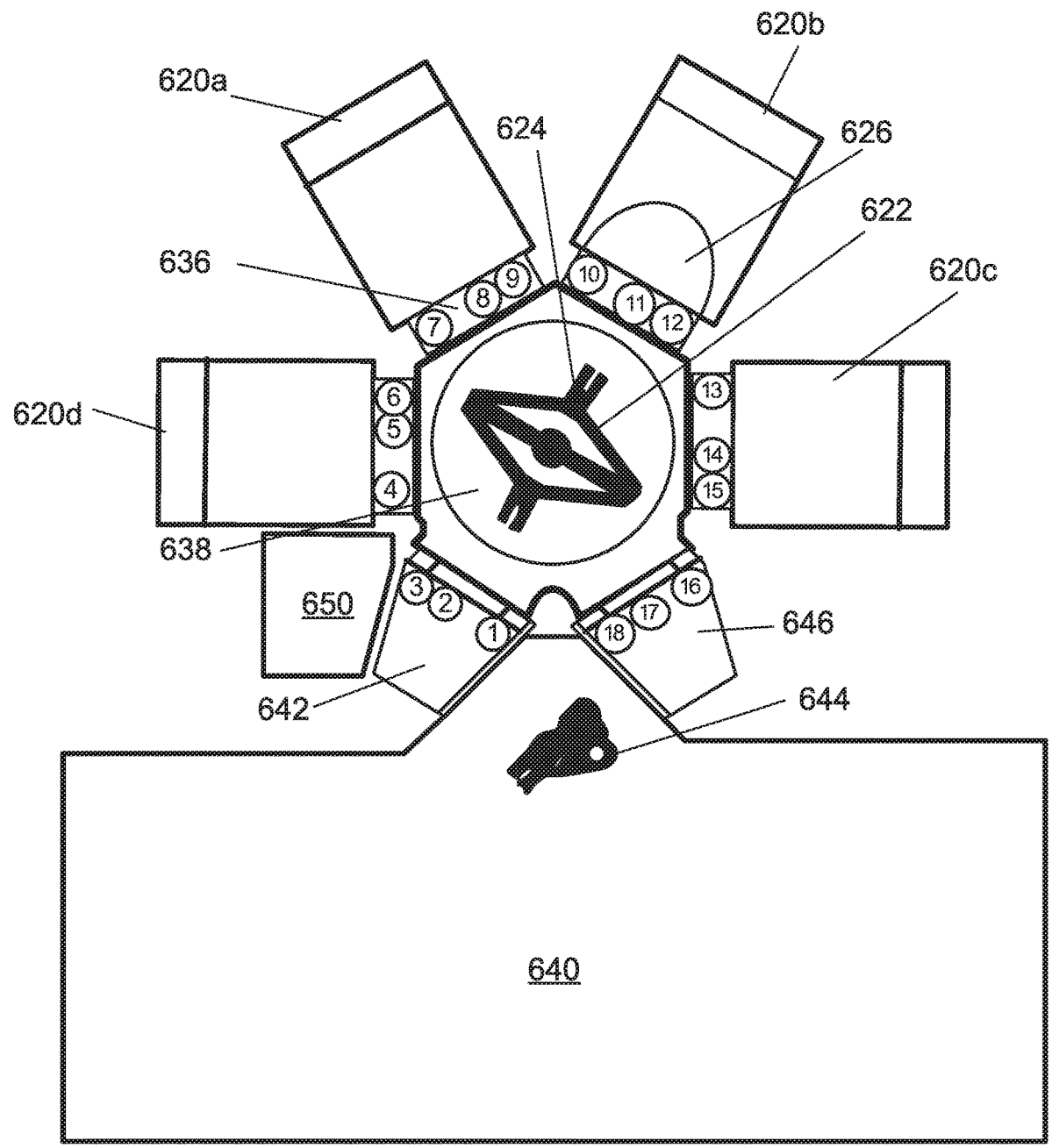
FIG. 6 depicts a semiconductor process cluster tool architecture with vacuum-integrated deposition and patterning modules that interface with a vacuum transfer module, suitable for implementation of processes described herein.

FIG. 5 schematically shows a cross-sectional view of an inductively coupled plasma apparatus 500 appropriate for implementing certain embodiments or aspects of embodiments such as dry development and/or etch, an example of which is a Kiyo® reactor, produced by Lam Research Corp. of Fremont, CA. The inductively coupled plasma apparatus 500 includes an overall process chamber 524 structurally defined by chamber walls 501 and a window 511. The chamber walls 501 may be fabricated from stainless steel or aluminum. The window 511 may be fabricated from quartz or other dielectric material. An optional internal plasma grid 550 divides the overall process chamber into an upper sub-chamber 502 and a lower sub chamber 503. In most embodiments, plasma grid 550 may be removed, thereby utilizing a chamber space made of sub chambers 502 and 503. A chuck 517 is positioned within the lower sub-chamber 503 near the bottom inner surface. The chuck 517 is configured to receive and hold a semiconductor wafer 519 upon which the etching and deposition processes are performed. The chuck 517 can be an electrostatic chuck for supporting the wafer 519 when present. In some embodiments, an edge ring (not shown) surrounds chuck 517, and has an upper surface that is approximately planar with a top surface of the wafer 519, when present over chuck 517. The chuck 517 also includes electrostatic electrodes for chucking and dechucking the wafer 519. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. The matching circuitry 521 is connected to the chuck 517 through a connection 525. In this manner, the RF power supply 523 is connected to the chuck 517. In various embodiments, a bias power of the electrostatic chuck may be set at about 50V or may be set at a different bias power depending on the process performed in accordance with disclosed embodiments. For example, the bias power may be between about 20 Vb and about 100 V, or between about 30 V and about 150 V.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross sections of coil 533 are shown with symbols, and coils having an "X" extend rotationally into the page, while coils having a "●" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. An optional Faraday shield 549a is positioned between the coil 533 and the window 511. The Faraday shield 549a may be maintained in a spaced apart relationship relative to the coil 533. In some embodiments, the Faraday shield 549a is disposed immediately above the window 511. In some embodiments, the Faraday shield 549b is between the window 511 and the chuck 517. In some embodiments, the Faraday shield 549b is not maintained in a spaced apart relationship relative to the coil 533.

For example, the Faraday shield 549b may be directly below the window 511 without a gap. The coil 533, the Faraday shield 549a, and the window 511 are each configured to be substantially parallel to one another. The Faraday shield 549a may prevent metal or other species from depositing on the window 511 of the process chamber 524.

Process gases may be flowed into the process chamber through one or more main gas flow inlets 560 positioned in the upper sub-chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 524 and to maintain a pressure within the process chamber 524. For example, the vacuum pump may be used to evacuate the lower sub-chamber 503 during a purge operation of ALD. A valve-controlled conduit may be used to fluidically connect the vacuum pump to the process chamber 524 so as to selectively control application of the vacuum environment provided by the vacuum pump. This may be done employing a closed loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus 500, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced by more complex gas flow inlets, one or more showerheads, for example. The Faraday shield 549a and/or optional grid 550 may include internal channels and holes that allow delivery of process gases to the process chamber 524. Either or both of Faraday shield 549a and optional grid 550 may serve as a showerhead for delivery of process gases. In some embodiments, a liquid vaporization and delivery system may be situated upstream of the process chamber 524, such that once a liquid reactant or precursor is vaporized, the vaporized reactant or precursor is introduced into the process chamber 524 via a gas flow inlet 560 and/or 570.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 etch features of and selectively deposit layers on the wafer 519.

If the plasma grid 550 is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus 500 is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at elevated temperatures ranging between about 10° C. and about 250° C. The temperature will depend on the process operation and specific recipe.

Apparatus 500 may be coupled to facilities (not shown) when installed in a clean room or a fabrication facility. Facilities include plumbing that provide processing gases, vacuum, temperature control, and environmental particle control. These facilities are coupled to apparatus 500, when installed in the target fabrication facility. Additionally, apparatus 500 may be coupled to a transfer chamber that allows robotics to transfer semiconductor wafers into and out of apparatus 500 using typical automation.

In some embodiments, a system controller 530 (which may include one or more physical or logical controllers) controls some or all of the operations of a process chamber 524. The system controller 530 may include one or more memory devices and one or more processors. In some embodiments, the apparatus 500 includes a switching system for controlling flow rates and durations when disclosed embodiments are performed. In some embodiments, the apparatus 500 may have a switching time of up to about 500 ms, or up to about 750 ms. Switching time may depend on the flow chemistry, recipe chosen, reactor architecture, and other factors.

In some implementations, the system controller 530 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be integrated into the system controller 530, which may control various components or subparts of the system or systems. The system controller, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication or removal of one or more layers, materials, metals, oxides, silicon, silicon dioxide, surfaces, circuits, and/or dies of a wafer.

The system controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer.

In some examples, the system controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the system controller 530 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, an EUV lithography chamber (scanner) or module, a dry development chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

EUVL patterning may be conducted using any suitable tool, often referred to as a scanner, for example the TWINSCAN NXE: 3300B® platform supplied by ASML of Veldhoven, NL). The EUVL patterning tool may be a standalone device from which the substrate is moved into and out of for deposition and etching as described herein. Or, as described below, the EUVL patterning tool may be a module on a larger multi-component tool. FIG. 6 depicts a semiconductor process cluster tool architecture with vacuum-integrated deposition, EUV patterning and dry development/etch modules that interface with a vacuum transfer module, suitable for implementation of the processes described herein. While the processes may be conducted without such vacuum integrated apparatus, such apparatus may be advantageous in some implementations.

FIG. 6 depicts a semiconductor process cluster tool architecture with vacuum-integrated deposition and patterning modules that interface with a vacuum transfer module, suitable for implementation of processes described herein. The arrangement of transfer modules to "transfer" wafers among multiple storage facilities and processing modules may be referred to as a "cluster tool architecture" system. Deposition and patterning modules are vacuum-integrated, in accordance with the requirements of a particular process. Other modules, such as for etch, may also be included on the cluster.

A vacuum transport module (VTM) 638 interfaces with four processing modules 620a-620d, which may be individually optimized to perform various fabrication processes. By way of example, processing modules 620a-620d may be implemented to perform deposition, evaporation, ELD, dry development, etch, strip, and/or other semiconductor processes. For example, module 620a may be an ALD reactor that may be operated to perform in a non-plasma, thermal atomic layer depositions as described herein, such as Vector tool, available from Lam Research Corporation, Fremont, CA And module 620b may be a PECVD tool, such as the Lam Vector®. It should be understood that the figure is not necessarily drawn to scale.

Airlocks 642 and 646, also known as a loadlocks or transfer modules, interface with the VTM 638 and a patterning module 640. For example, as noted above, a suitable patterning module may be the TWINSCAN NXE: 3300B® platform supplied by ASML of Veldhoven, NL). This tool architecture allows for work pieces, such as semiconductor substrates or wafers, to be transferred under vacuum so as not to react before exposure. Integration of the deposition modules with the lithography tool is facilitated by the fact that EUVL also requires a greatly reduced pressure given the strong optical absorption of the incident photons by ambient gases such as $H_2O$, $O_2$, etc.

As noted above, this integrated architecture is just one possible embodiment of a tool for implementation of the described processes. The processes may also be implemented with a more conventional stand-alone EUVL scanner and a deposition reactor, such as a Lam Vector tool, either stand alone or integrated in a cluster architecture with other tools, such as etch, strip etc. (e.g., Lam Kiyo or Gamma tools), as modules, for example as described with reference to FIG. 6 but without the integrated patterning module.

Airlock 642 may be an "outgoing" loadlock, referring to the transfer of a substrate out from the VTM 638 serving a deposition module 620a to the patterning module 640, and airlock 646 may be an "ingoing" loadlock, referring to the transfer of a substrate from the patterning module 640 back in to the VTM 638. The ingoing loadlock 646 may also provide an interface to the exterior of the tool for access and egress of substrates. Each process module has a facet that interfaces the module to VTM 638. For example, deposition process module 620a has facet 636. Inside each facet, sensors, for example, sensors 1-18 as shown, are used to detect the passing of wafer 626 when moved between respective stations. Patterning module 640 and airlocks 642 and 646 may be similarly equipped with additional facets and sensors, not shown.

Main VTM robot 622 transfers wafer 626 between modules, including airlocks 642 and 646. In one embodiment, robot 622 has one arm, and in another embodiment, robot 622 has two arms, where each arm has an end effector 624 to pick wafers such as wafer 626 for transport. Front-end robot 644, in is used to transfer wafers 626 from outgoing airlock 642 into the patterning module 640, from the patterning module 640 into ingoing airlock 646. Front-end robot 644 may also transport wafers 626 between the ingoing loadlock and the exterior of the tool for access and egress of substrates. Because ingoing airlock module 646 has the ability to match the environment between atmospheric and vacuum, the wafer 626 is able to move between the two pressure environments without being damaged.

It should be noted that a EUVL tool typically operates at a higher vacuum than a deposition tool. If this is the case, it is desirable to increase the vacuum environment of the substrate during the transfer between the deposition to the EUVL tool to allow the substrate to degas prior to entry into the patterning tool. Outgoing airlock 642 may provide this function by holding the transferred wafers at a lower pressure, no higher than the pressure in the patterning module 640, for a period of time and exhausting any off-gassing, so that the optics of the patterning tool 640 are not contaminated by off-gassing from the substrate. A suitable pressure for the outgoing, off-gassing airlock is no more than 1E-8 Torr.

In some embodiments, a system controller 650 (which may include one or more physical or logical controllers) controls some or all of the operations of the cluster tool and/or its separate modules. It should be noted that the controller can be local to the cluster architecture, or can be located external to the cluster architecture in the manufacturing floor, or in a remote location and connected to the cluster architecture via a network. The system controller 650 may include one or more memory devices and one or more processors. The processor may include a central processing unit (CPU) or computer, analog and/or digital input/output connections, stepper motor controller boards, and other like components. Instructions for implementing appropriate control operations are executed on the processor. These instructions may be stored on the memory devices associated with the controller or they may be provided over a network. In certain embodiments, the system controller executes system control software.

The system control software may include instructions for controlling the timing of application and/or magnitude of any aspect of tool or module operation. System control software may be configured in any suitable way. For example, various process tool component subroutines or control objects may be written to control operations of the process tool components necessary to carry out various process tool processes. System control software may be coded in any suitable compute readable programming language. In some embodiments, system control software includes input/output control (IOC) sequencing instructions for controlling the various parameters described above. For example, each phase of a semiconductor fabrication process may include one or more instructions for execution by the system controller. The instructions for setting process conditions for condensation, deposition, evaporation, patterning and/or etching phase may be included in a corresponding recipe phase, for example.

In various embodiments, an apparatus for forming a negative pattern mask is provided. The apparatus may include a processing chamber for patterning, deposition and etch, and a controller including instructions for forming a negative pattern mask. The instructions may include code for, in the processing chamber, patterning a feature in a chemically amplified (CAR) resist on a semiconductor substrate by EUV exposure to expose a surface of the substrate, dry developing the photopatterned resist, and etching the underlying layer or layer stack using the patterned resist as a mask.

It should be noted that the computer controlling the wafer movement can be local to the cluster architecture, or can be located external to the cluster architecture in the manufacturing floor, or in a remote location and connected to the cluster architecture via a network. A controller as described above with respect to any of FIG. 3, 4 or 5 may be implemented with the tool in FIG. 6.

CONCLUSION

Process and apparatus for dry development of metal and/or metal oxide photoresists, for example to form a patterning mask in the context of EUV patterning is disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed:

1. A method of processing a semiconductor substrate, comprising:
providing in a process chamber an EUV patterned resist on a substrate layer on a semiconductor substrate, wherein the EUV patterned resist comprises an unexposed organo-metal-oxide portion and an exposed metal-oxide portion where the organic substituents were cleaved off by the EUV exposure; and dry developing the EUV patterned resist by removing either the exposed portion or the unexposed portion of the EUV patterned resist by a dry development process comprising exposure to a chemical compound that is selective between the organo-metal-oxide and the metal-oxide portions to form a resist mask.

2. The method of claim 1, wherein the EUV patterned resist is vapor-deposited on the substrate layer.

3. The method of claim 1, wherein the EUV patterned resist is spin-coated on the substrate layer.

4. The method of claim 1, wherein the EUV patterned resist comprises an organotin oxide.

5. The method of claim 1, wherein the dry development process comprises a plasma.

6. The method of claim 1, wherein the dry development process comprises a plasma-free thermal process.

7. The method of claim 1, wherein the dry development process comprises exposure to a compound comprising $R_xZ_y$, where R=B, Al, Si, C, S, SO with x>0 and Z=Cl, H, Br, F, $CH_4$ and y>0 at a suitable flow rate for a suitable time, pressure and temperature.

8. The method of claim 1, wherein the EUV patterned resist is an organotin oxide-containing 10-20 nm thick thin film deposited based on a gas phase reaction of the organotin precursor isopropyl(tris)(dimethylamino) tin and water vapor subjected to a EUV exposure dose and post-exposure bake, and the dry development process comprises a non-plasma thermal exposure of the EUV patterned resist at 120° C., 10 mT, 500 sccm $BCl_3$, for 30 seconds.

9. The method of claim 1, further comprising after dry developing to form the resist mask, etching the substrate layer using the resist mask.

10. The method of claim 1, wherein the EUV patterned resist is sensitive to a radiation source selected from the group consisting of DUV, X-ray, and e-beam radiation.

11. The method of claim 1, wherein the chemical compound comprises $BCl_3$.

12. The method of claim 1, wherein the exposed portion comprises the metal oxide containing portion and the unexposed portion comprises the organo-metal-oxide containing portion, and wherein the unexposed portion is removed.

* * * * *